US009639480B2

(12) United States Patent
Waldspurger et al.

(10) Patent No.: US 9,639,480 B2
(45) Date of Patent: *May 2, 2017

(54) DYNAMIC CACHE ALLOCATION ADJUSTMENT USING MULTIPLE CACHE SIMULATIONS FOR EFFICIENT CACHE UTILITY CURVE CONSTRUCTION

(71) Applicant: Cloud Physics, Inc., Santa Clara, CA (US)

(72) Inventors: Carl A. Waldspurger, Palo Alto, CA (US); Irfan Ahmad, Redwood City, CA (US); Alexander Garthwaite, South Hamilton, MA (US); Nohhyun Park, Redwood City, CA (US)

(73) Assignee: CLOUD PHYSICS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/237,645

(22) Filed: Aug. 16, 2016

(65) Prior Publication Data

US 2016/0357686 A1     Dec. 8, 2016

Related U.S. Application Data

(63) Continuation of application No. 15/004,877, filed on Jan. 22, 2016, now Pat. No. 9,418,020, which is a continuation-in-part of application No. 13/799,942, filed on Mar. 13, 2013, now Pat. No. 9,336,141, and (Continued)

(51) Int. Cl.

| | | |
|---|---|---|
| *G06F 12/00* | (2006.01) | |
| *G06F 12/123* | (2016.01) | |
| *G06F 12/121* | (2016.01) | |
| *G06F 12/0893* | (2016.01) | |
| *G06F 12/0802* | (2016.01) | |
| *G06F 17/50* | (2006.01) | |
| *G06F 11/34* | (2006.01) | |
| *G06F 12/0846* | (2016.01) | |

(Continued)

(52) U.S. Cl.
CPC ........ *G06F 12/123* (2013.01); *G06F 11/3447* (2013.01); *G06F 12/0802* (2013.01); *G06F 12/0848* (2013.01); *G06F 12/0893* (2013.01); *G06F 12/1018* (2013.01); *G06F 12/121* (2013.01); *G06F 12/128* (2013.01); *G06F 17/5022* (2013.01); *G06F 2212/1021* (2013.01); *G06F 2212/401* (2013.01); *G06F 2212/601* (2013.01); *G06F 2212/69* (2013.01)

(58) Field of Classification Search
CPC ............ G06F 12/0891; G06F 12/0802; G06F 11/3447; G06F 17/5022; G06F 2212/601; G06F 12/08
USPC ......................................................... 711/154
See application file for complete search history.

(56) References Cited

U.S. PATENT DOCUMENTS 6,952,664 B1 * 10/2005 Lahiri ................. G06F 17/5022
703/13

* cited by examiner

*Primary Examiner* — Matthew Bradley
(74) *Attorney, Agent, or Firm* — Jeffrey Pearce

(57) ABSTRACT

The configuration of a cache is adjusted within a computer system that includes at least one entity that submits a stream of references, each reference corresponding to a location identifier corresponding to data storage locations in a storage system. The reference stream is spatially sampled using reference hashing. Cache utility values are determined for each of a plurality of caching simulations and an optimal configuration is selected based on the results of the simulations.

11 Claims, 13 Drawing Sheets

Related U.S. Application Data a continuation-in-part of application No. 14/315,678, filed on Jun. 26, 2014, now Pat. No. 9,405,686.

(60) Provisional application No. 62/106,693, filed on Jan. 22, 2015.

(51) Int. Cl.
*G06F 12/1018* (2016.01)
*G06F 12/128* (2016.01)

DYNAMIC CACHE ALLOCATION ADJUSTMENT USING MULTIPLE CACHE SIMULATIONS FOR EFFICIENT CACHE UTILITY CURVE CONSTRUCTION

CROSS-REFERENCE TO RELATED APPLICATIONS

This application is a Continuation of U.S. patent application Ser. No. 15/004,877, filed 22 Jan. 2016, which issued on 16 Aug. 2016 as U.S. Pat. No. 9,418,020 and which in turn claimed priority of U.S. Provisional Patent Application No. 62/106,693, filed 22 Jan. 2015, and was also a Continuation-in-Part of and claimed priority of both U.S. patent application Ser. No. 13/799,942, filed 13 Mar. 2013, which issued on 10 May 2016 as U.S. Pat. No. 9,336,141, and U.S. patent application Ser. No. 14/315,678, filed 26 Jun. 2014.

BACKGROUND

Caches designed to accelerate data access by exploiting locality are pervasive in modern storage systems. Operating systems (OS's) and databases maintain in-memory buffer caches containing "hot" blocks considered likely to be reused. When an OS needs to access a block, it may first look in a cache. If the block is cached, there is a "hit" and the OS can access it right away. If, however, the block is not in the cache (a "miss"), then the OS must access it using the normal addressing techniques to retrieve the block from slower memory or storage. Server-side or networked storage caches using flash memory are popular as a cost-effective way to reduce application latency and offload work from rotating disks. Virtually all storage devices—ranging from individual disk drives to large storage arrays—include significant caches composed of RAM or flash memory. Since cache space consists of relatively fast, expensive storage, it is inherently a scarce resource, and is commonly shared among multiple clients. As a result, optimizing cache allocations is important, and approaches for estimating workload performance as a function of cache size are particularly valuable.

Cache Utility Curves

Cache utility curves (CUCs) are effective tools for managing cache allocations. Such curves plot a performance metric as a function of cache size. FIG. 1 shows an example miss-ratio curve (MRC, which may also abbreviate miss rate curve), which plots the ratio of cache misses to total references for a workload (y-axis) as a function of cache size (x-axis). The higher the miss ratio, the worse the performance; furthermore, the miss ratio decreases as cache size increases. MRCs come in many shapes and sizes, and represent the historical cache behavior of a particular workload. The MRC example of FIG. 1 illustrates the inherent trade-off: One can reduce the likelihood of misses by making the cache larger, but this leads to greater cost to provide the faster devices that are used for the cache. Instead of evaluating miss ratios as a function of cache size, some other known systems evaluate miss rates and thus miss rate curves, which have analogous properties and can provide similar information to system designers. Both miss ratio curves and miss rate curves are thus different choices for CUCs.

Assuming some level of stationarity in the workload pattern at the time scale of interest, its MRC can be used to predict its future cache performance. An administrator can use a system-wide miss ratio curve to help determine the aggregate amount of cache space to provision for a desired improvement in overall system performance. Similarly, an automated cache manager can utilize separate MRCs for multiple workloads of varying importance, optimizing cache allocations dynamically to achieve service-level objectives.

Weaker Alternatives

The concept of a working set, defined as the set of data accessed during the most recent sample interval, is often used by online allocation algorithms in systems software. While working-set estimation provides valuable information, it doesn't measure data reuse, nor does it predict the magnitude of the performance change that can be expected as cache allocations are varied. Without the type of information conveyed in a cache utility curve, administrators or automated systems seeking to optimize cache allocations are forced to resort to simple heuristics, or to engage in trial-and-error tests. Both approaches are problematic.

Heuristics simply don't work well for cache sizing, since they cannot capture the temporal locality profile of a workload. Without knowledge of marginal benefits, for example, doubling (or halving) the cache size for a given workload may change its performance only slightly, or by a dramatic amount.

Trial-and-error tests that vary the size of a cache and measure the effect are not only time-consuming and expensive, but also present significant risk to production systems. Correct sizing requires experimentation across a range of cache allocations; some might induce thrashing and cause a precipitous loss of performance. Moreover, long-running experiments required to warm up caches or to observe business cycles may exacerbate the negative effects. In practice, administrators rarely have time for this.

Although CUCs are useful for planning and optimization, existing algorithms used to construct them are computationally expensive. To construct an exact MRC, it is necessary to observe data reuse over the access trace. Every accessed location must be tracked and stored in data structures during trace processing, resulting in large overheads in both time and space. One technique due to Mattson, et al., ("Evaluation techniques for storage hierarchies", IBM Syst. J. 9,2 (June 1970), 78-117) scans the trace of references to collect a histogram of reuse distances. The reuse distance for an access to a block B is measured as the number of other intervening unique blocks referenced since the previous access to B. The number of times a particular reuse distance occurs is collected while processing the trace, over all possible reuse distances. Conceptually, for modeling LRU ("Least Recently Used"), accessed blocks are totally ordered in a stack from most recent to least recent access. On an access to block B, it:

determines the reuse distance of B as: D=stack depth of B (for first access to B, D=∞), records D in a reuse-distance histogram, and moves B to the top of stack.

Standard implementations maintain a balanced tree to track the most recent references to each block and compute reuse distances efficiently, and employ a hash table for fast lookups into this tree. For a trace of length N containing M unique references, the most efficient implementations of this algorithm have an asymptotic cost of (N log M) time and (M) space.

Given the non-linear computation cost and unbounded memory requirements, it is impractical to perform real-time analysis in production systems. Even when processing can be delayed and performed offline from a trace file, memory requirements may still be excessive. This is especially important when modeling large storage caches; in contrast to RAM-based caches, affordable flash cache capacities often exceed 1 TB, requiring many gigabytes of RAM for traditional MRC construction.

DETAILED DESCRIPTION

Figure 1:
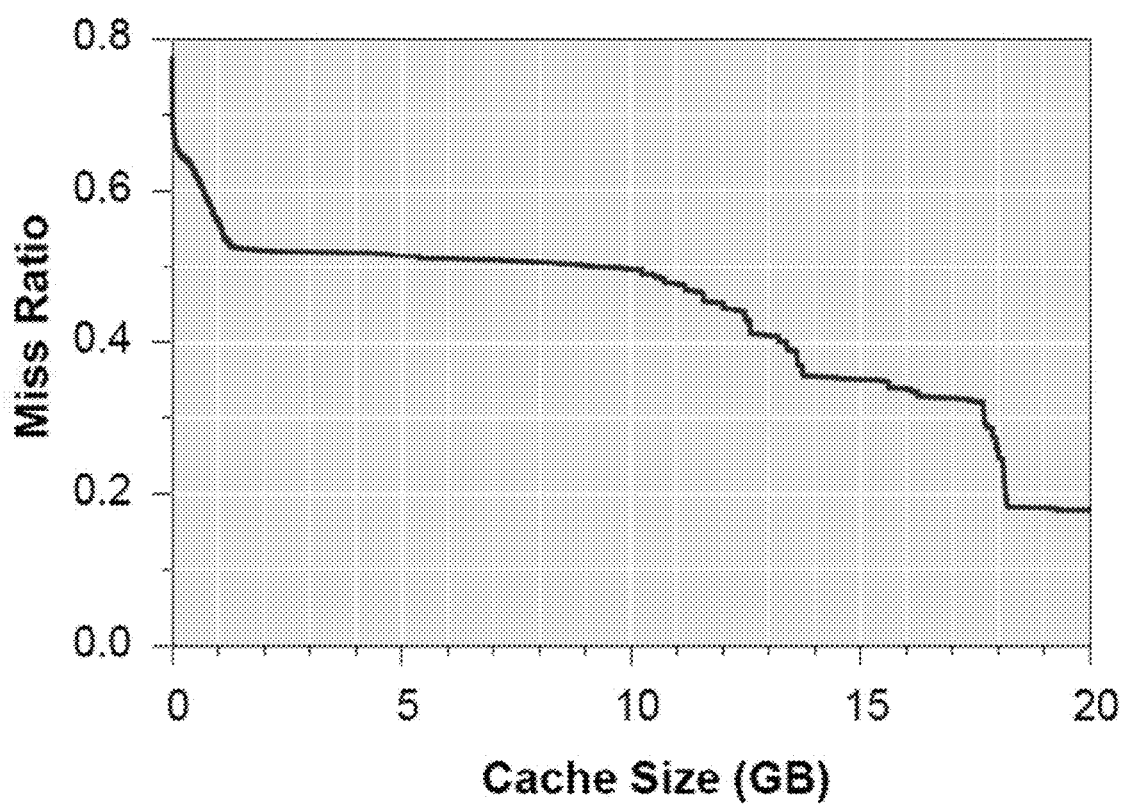
FIG. 1 illustrates a cache utility curve.

Disclosed here is a new approach that enables determination of reuse-distance to construct accurate CUCs using only modest computational resources. Different embodiments described here extend and improve on the methods disclosed by the present inventors in U.S. patent application Ser. No. 14/215,678 (Waldspurger, et al., published as U.S. Published Patent Application 2014/0310462). For convenience, this new approach is referred to below as "SHARDS", for "Spatially Hashed Approximate Reuse Distance Sampling". In broad terms, SHARDS employs randomized spatial sampling, implemented by tracking only references to representative locations, selected dynamically based on a function of their hash values. In a further embodiment, SHARDS runs in constant space by lowering the sampling rate adaptively.

The SHARDS method requires several orders of magnitude less space and time than exact methods, and is inexpensive enough for practical online MRC construction in high-performance systems. The dramatic space reductions also enable analysis of long traces, which is not typically feasible with exact methods; indeed, embodiments need not be limited to bounded (for example, time-limited) traces, but may even be applied to continuous streams, such as might be generated by long-running workloads. Here, a "trace" is any stream containing identifiers for memory/storage locations that may be cached. The "location" L may be a location such as an address, or block number, or any other identifier used to designate a corresponding portion of system memory, or disk storage, or some other I/O device (for example, onboard memory of a video card, or an address to a data buffer, etc.), or any other form of device, physical or virtual, whose identifier is used to create cache entries. Any reference below to one of these options is by way of example only and is not intended to be limiting.

Similarly, "data" is also used here to indicate any form of stored digital information, including "pure" data as well as instructions, etc. Embodiments of the invention may be used to provide information to construct either type of CUC, that is, miss rate curves or miss ratio curves. Unless clear from context, such as in the description of plots of experimental results using one type of CUC or the other, it is to be assumed that embodiments can operate with either type of CUC, even if only one variant is mentioned in relation to a given example or description of a feature.

As one example of the efficiency of an embodiment of this invention, traces that consume many gigabytes of RAM to construct exact MRCs may require less than 1 MB for accurate approximations. This low cost also enables concurrent evaluation of different cache configurations (e.g., block size or write policy) using multiple SHARDS instances. Various embodiments also present a related generalization to non-LRU policies.

One of many examples of a practical use of SHARDS is in the context of a commercial I/O caching analytics service for virtualized environments. One prototype of such a system streams compressed block I/O traces for virtual disks from customer data centers to a cloud-based backend that constructed approximate MRCs efficiently. A web-based interface reported expected cache benefits, such as the cache size required to reduce average I/O latency by specified amounts. Running this service, the inventors were able to accumulate a large number of production traces from customer environments.

To evaluate embodiments of this invention, the inventors analyzed both exact and approximate MRCs for more than a hundred virtual disks from a trace library, plus additional publicly-available block I/O traces. Averaged across all traces, the miss ratios of the approximated MRCs, constructed using a 0.1% sampling rate, deviated in absolute value from the exact MRCs by an average of less than 0.02, i.e., the approximate sampled miss ratio is within two percentage points of the value calculated exactly using the full trace.

Moreover, approximate MRCs constructed using a fixed sample-set size, with only 8K samples in less than 1 MB memory, deviated by an average of less than 0.01 from the exact full-trace values. This high accuracy was achieved despite dramatic memory savings by a factor of up to 10,800× for large traces, with a median of 185× across all traces. The computation cost was also reduced up to 204× for large traces, with a median of 22×.

The overall structure and order of the following description is: The SHARDS routine itself is described, along with an extended version that runs in constant space. Details of a novel MRC construction implementation are then examined, followed by results of an evaluation of SHARDS based on quantitative experiments on more than a hundred real-world I/O traces. A system configured to implementation SHARDS is described. Related work is thereafter discussed, followed by a summary of conclusions and a discussion of other potential alternative embodiments and uses.

SHARDS Sampling

SHARDS derived from an investigation of the consequences of computing reuse distances for a randomly sampled subset of referenced blocks, that is, units of memory and/or storage that an OS (or any other software that manages a cache, such as a hypervisor, runtime system, database, key-value store, etc.) needed to access, either for its own purposes or on behalf of an application. One result of this investigation led to a routine based on spatially-hashed sampling. Although various embodiments are described in the context of storage MRCs, they can also be applied more generally to approximate other cache utility curves, with any stream of references containing virtual or physical location identifiers.

Basic SHARDS

According to an embodiment of the SHARDS method, for each referenced location L, and with a selected standard hash function hash, the decision of whether or not to sample L is based on whether hash(L) satisfies at least one condition. For example, the condition hash(L) mod 100 <K samples approximately K percent of the entire location space. Assuming a reasonable hash function, this effectively implements uniform random spatial sampling.

This method has several desirable properties. As required for reuse distance computations, it ensures that all accesses to the same location will be sampled, since they will have the same hash value. It does not require any prior knowledge about the system, its workload, or the location address space. In particular, no information is needed about the set of locations that may be accessed by the workload, nor the distribution of accesses to these locations. As a result, SHARDS sampling is effectively stateless. In contrast, explicitly pre-selecting a random subset of locations, as in some prior art systems, may require significant storage, especially if the location address space is large. Often, only a small fraction of this space is accessed by the workload, making such pre-selection especially inefficient. More generally, using the sampling condition hash(L) mod P<T, with modulus P and threshold T, the effective sampling rate is R=T/P, and each sample represents 1/R locations, in a statistical sense. The sampling rate may be varied by changing the threshold T dynamically. When the threshold is lowered from T to T', a subset-inclusion property is maintained automatically: Each location sampled after lowering the rate would also have been sampled prior to lowering the rate; since T'<T, the samples selected with T' are a proper subset of those selected with T.

Fixed-Rate MRC Construction Embodiment

Figure 2:
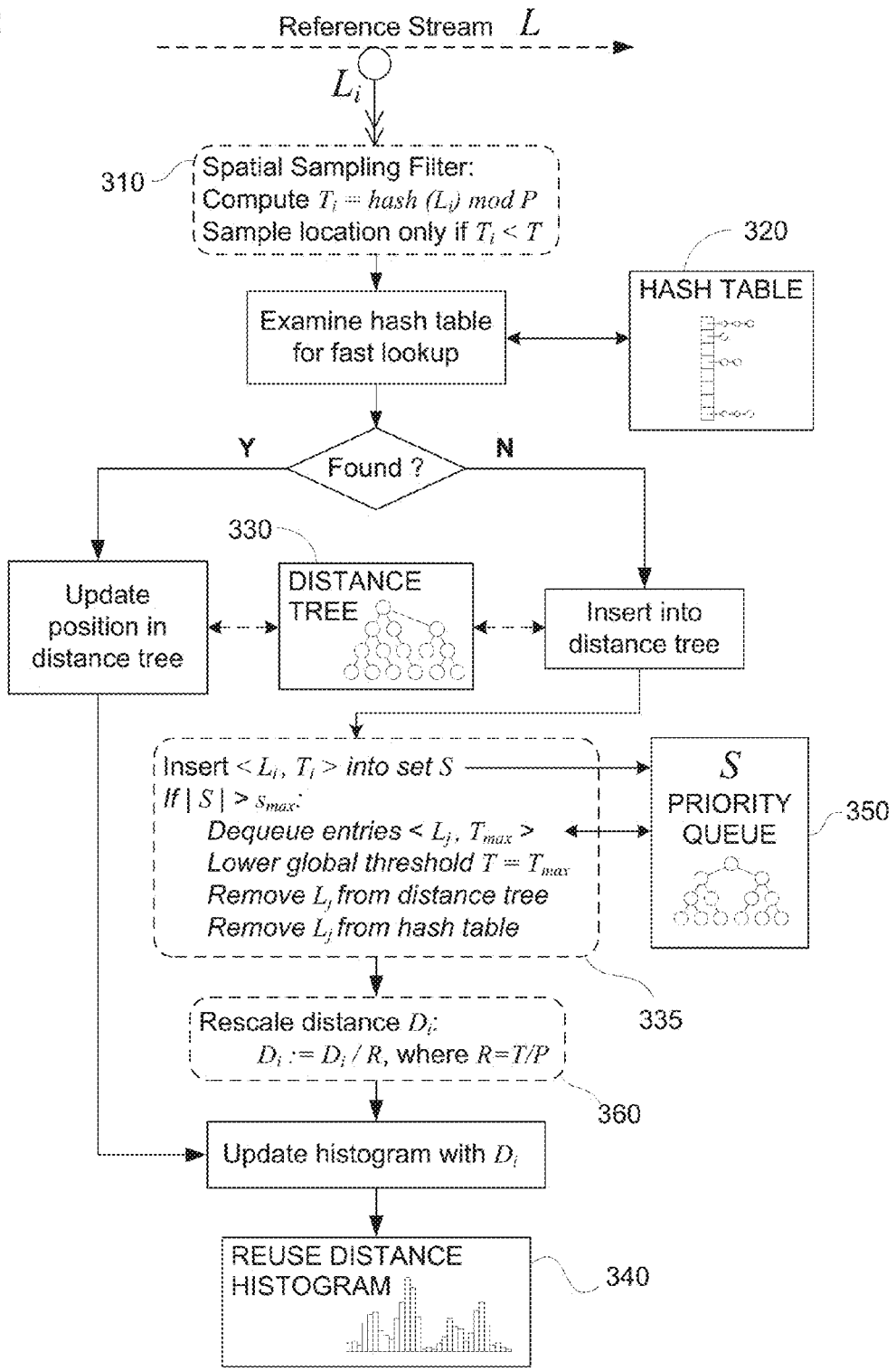
FIG. 2 is a flowchart that shows the main procedural steps of a fixed-size embodiment that implements an improved method for CUC construction; a subset of the steps shown in this figure also shows a fixed-rate embodiment.

Conventional reuse-distance algorithms construct an exact MRC from a complete reference trace. FIG. 2 illustrates some of the main features of a fixed-rate embodiment of SHARDS, but also including additional steps that may be included to implementation a fixed-size embodiment as well. Although SHARDS embodiments may modify even some known procedures, the "rounded" boxes in FIG. 2 are unique to the fixed-rate and fixed-size embodiments of SHARDS. The reference stream is monitored, that is, traced, to create a sequence $L_i$ of references.

Although most practical implementations of the invention will choose to tap and test every reference in the sequence(s) L issuing from a/the client(s), it would also be possible to select, for example, every n'th reference of L, or references selected randomly, or make selections based on other properties, such as only reads or only writes, only certain block sizes, etc., in which cases the "stream", as meant in this description, is whatever sub-set of the complete reference sequence is used as the input to the spatial sampling filter 310, every one of which is then filtered. These references are filtered (310) with respect to the current threshold T, in particular, selecting as samples only those references for which $T_i$=hash $(L_i)$ mod P<T.

To speed lookup of the reference, a hash table 320 may be queried, although slower data structures may also be used for lookup. If the reference is found in the table, its position in a (re-use) distance tree 330 is updated, and a reuse distance histogram 340 is updated with the reference's reuse distance $D_i$, which will have been stored previously in a distance tree 330, which may be included for faster lookup, although any known data structure may be used to store distances. If the sampled reference is not already in the hash table 320, however, its reuse distance is computed in any conventional manner before it is preferably inserted into the distance tree 330.

FIG. 2 also shows a step 335, which may be included in case a fixed-size embodiment is to be implemented. The sub-steps relating to such a fixed-size implementation, and the interaction with a data structure S 350, are described in further detail below.

For both the fixed-rate and fixed-size embodiments, the distance $D_i$ is then preferably rescaled (step 360, see below for more detail) and the reuse distance histogram 340 is then updated with the (rescaled) distance value for the current location $L_i$. Instead of compiling a histogram, it would also be possible to compile and present the cache utility information in other ways, such as by directly constructing an MRC for display for a user, or for an automatic cache-allocation routine, who/which can then adjust the cache allocation accordingly.

Standard MRC construction routines are computationally expensive. Consider a reference stream containing N total references to M unique locations. While an optimized implementation using efficient data structures requires only O(N log M) time, it still consumes O(M) space for the hash table 320 and balanced tree 330 used to compute reuse distances. SHARDS, however, can be used to construct an approximate MRC in dramatically less time and space. With a fixed sampling rate R, the expected number of unique sampled locations becomes R·M. Assuming the sampled locations are fairly representative, the total number of sampled references is reduced to approximately R·N. As shown below, for typical workloads, even a value for R as low as R=0.001 yields very accurate MRCs, using memory and processing resources that are orders of magnitude smaller than conventional approaches.

Fixed-Size MRC Construction Embodiment

Fixed-rate MRC construction achieves a radical reduction in computational resource requirements. Nevertheless, even with a low, constant sampling rate, space requirements may still grow without bound, along with the total number of unique locations that must be tracked. For memory-constrained environments, such as production cache controller firmware where MRCs could inform cache allocation decisions, it is desirable to place an upper bound on memory size.

An additional issue is the choice of an appropriate sampling rate, R, since the accuracy of MRC approximation using spatial sampling also depends on N and M. When these values are small, it is preferable to use a relatively large value for R (such as 0.1) to improve accuracy. When these values are large, it is preferable to use a relatively small value of R (such as 0.001), to avoid wasting or exhausting available resources. Weighing these tradeoffs is difficult, especially with incomplete information. This suggests that accuracy may depend more on an adequate sample size than a particular sampling rate. This observation motivates an extended version of SHARDS that constructs an MRC in (1) space and (N) time, regardless of the size or other properties of its input trace.

Sampling Rate Adaptation

An appropriate sampling rate may be determined automatically, that is, the rate need not be specified in all implementations. In this embodiment, the sampling rate is thus lowered adaptively, in order to maintain a fixed bound on the total number of sampled locations that are tracked at any given point in time. The sampling rate may be initialized to a high value, and lowered gradually as more unique locations are encountered. This approach leverages the subset-inclusion property maintained by SHARDS as the rate is reduced.

Initially, the sampling rate may be set to a high value, such as $R_0$=1.0, the maximum possible value. This may be implemented by using a sampling condition of the form hash(L) mod P<T, and setting the initial threshold T=P, so that every location L will be selected. In practice, the inventors have found that setting $R_0=0.1$ is sufficiently high for nearly any practical workload, although this is of course a design choice. Note that it would be possible to use an equivalent threshold condition that differs from the one shown by including one or more scaling constants, using a operator instead of <, reformulating the condition as hash(L) mod P*>T, where P*=1–P, etc., but these functions are all equivalent to the one discussed primarily here and are simple and obvious reformulations of the same inventive concept.

The goal of operating in constant space implies that the system (such as one or more software modules comprising executable code stored in a non-transitory medium within a computer) cannot continue to track all sampled references. As shown in FIG. 2, a new auxiliary data structure 350 may therefore be introduced to maintain a fixed-size set S with cardinality |S|. Each element of S is a tuple $(L_i, T_i)$ consisting of an actively-sampled location $L_i$, and its associated threshold value, $T_i$=hash(L) mod P. Let $s_{max}$ denote the maximum desired size |S| of set S, that is, $s_{max}$ is a constant representing an upper bound on the number of actively sampled locations. S can be implemented efficiently as a priority queue 350, ordered by the tuple's threshold value.

When the first reference to a location L that satisfies the current sampling condition is processed, it is a cold miss, since it has never been resident in the cache. In this case, L is not already in S, so it must be added to the set. If, after adding L, the bound on the set of active locations would be exceeded, such that $|S|>s_{max}$, then the size of S must be reduced. The element $(L_i, T_i)$ with the largest threshold value $T_{max}$ is removed from the set, using for example a priority-queue dequeue operation. The threshold T used in the current sampling condition is reduced to $T_{max}$, effectively reducing the sampling rate from $R_{old}$=T/P to a new, strictly lower rate $R_{new}=T_{max}/P$, narrowing the criteria used for future sample selection.

The corresponding location $L_i$ is also removed from all other data structures, such as the hash table 320 and tree, which may be found even in prior art implementations. If any additional elements of S have the same threshold $T_{max}$, then they are also removed from S in the same manner.

Histogram Count Rescaling

As with fixed-rate sampling, reuse distances must be scaled by 1/R to reflect the sampling rate. An additional consideration for the fixed-size case is that R is adjusted dynamically. As the rate is reduced, the counts associated with earlier updates to the reuse-distance histogram 340 (found even in conventional Mattson-type systems, as mentioned above) need to be adjusted. Ideally, the effects of all updates associated with an evicted sample should be rescaled exactly. Since this would incur significant space and processing costs, however, embodiments of the invention preferably apply an approximation.

When the threshold is reduced, the count associated with each histogram bucket is scaled by the ratio of the new and old sampling rates, $R_{new}/R_{old}$, which is equivalent to the ratio of the new and old thresholds, $T_{new}/T_{old}$. Rescaling makes the simplifying assumption that previous references to an evicted sample contributed equally to all existing buckets. While this is unlikely to be true for any individual sample, it is nonetheless a reasonable statistical approximation when viewed over many sample evictions and rescaling operations. Rescaling ensures that subsequent references to the remaining samples in S have the appropriate relative weight associated with their corresponding histogram bucket increments.

Conceptually, rescaling should occur immediately each time the current sampling threshold T is reduced. In practice, to avoid the expense of rescaling all histogram counts on every threshold change, it is instead preferably performed incrementally. This is accomplished efficiently by storing $T_{bucket}$ with each histogram bucket, representing the sampling threshold in effect when the bucket was last updated. When incrementing a bucket count, if $T_{bucket} \neq T$, then the existing count is first rescaled by $T/T_{bucket}$, the count is incremented, and $T_{bucket}$ is set to T During the final step in MRC construction, when histogram buckets are summed to generate miss ratios, any buckets for which $T_{bucket} \neq T$ should be similarly rescaled.

One embodiment used fixed-point values encoded as scaled integer values for histogram bucket counts. Floating-point (FP) was avoided because this is not typically used in kernel-mode code (to avoid saving/restoring FP registers), and because some low-end controller processors don't have hardware support for FP. An alternative is to use floating-point representations for histogram bucket counts, however, but then to use +1/T (or equivalently, +1/R) for increments. Note that with this implementation, there's no need for rescaling, since all increments will be in the same units, with later increment amounts growing larger as the threshold is decreased dynamically. New updates will therefore count for more than old ones, which is analogous to scaling down the relatively old ones.

Design and Implementation

Many different embodiments of SHARDS may be implemented based on existing reuse-distance algorithms, each of which represents a different trade-off choice involving space efficiency. Below are described aspects of both a fixed-rate and fixed-size MRC construction implementation. Considerations for modeling various cache policies are also discussed.

Fixed-Rate Implementation

To facilitate comparison of this embodiment of the invention with a known baseline, the inventors started with the sequential version of the open-source C implementation of PARDA. See, for example, Niu, Q., et al., "PARDA: A fast parallel reuse distance analysis algorithm", Proceedings of the 2012 IEEE 26th International Parallel and Distributed Processing Symposium, Washington, D.C., USA, 2012), IPDPS '12, IEEE Computer Society, pp. 1284-1294. PARDA takes a trace file as input, and performs offline reuse distance analysis, yielding an MRC.

In experimental tests, the fixed-rate embodiment of this invention leveraged two key data structures: a hash table that maps a location to the timestamp of its most recent reference, and a splay tree (see Sleator, D., et al., "Self-adjusting binary search trees. J. ACM 32, 3, July 1985, pp. 652-686; and Smaragdakis, Y., et al., "The EELRU adaptive replacement algorithm. Perform. Eval. 53, 2 (2003), pp. 93-123) that is used to compute the number of distinct locations referenced since this timestamp. First, each referenced location read from the trace file is hashed, and processed only if it meets the specified sampling condition hash(L) mod P<T. For efficiency, the modulus P was set to a power of two (for example, in one case $P=2^{24}$, providing sufficient resolution to represent very low sampling rates, while still avoiding integer overflow when using 64-bit arithmetic for scaling operations) and "mod P" was replaced with the less expensive bit-wise mask operation "& (P–1)". For a given sampling rate R, the threshold T was set to round(R·P). For the hash function, the inventors used the public domain C implementation of MurmurHash3. The inventors also experimented with other hash functions, including a fast pseudo-random number generator, and found that they yielded nearly identical results.

Next, computed reuse distances were adjusted to reflect the sampling rate. Each raw distance D was then divided by R to yield the appropriately scaled distance D=R. Since R=T/P, the scaled distance (D·P)/T was computed efficiently using an integer shift and division.

Figure 3A:
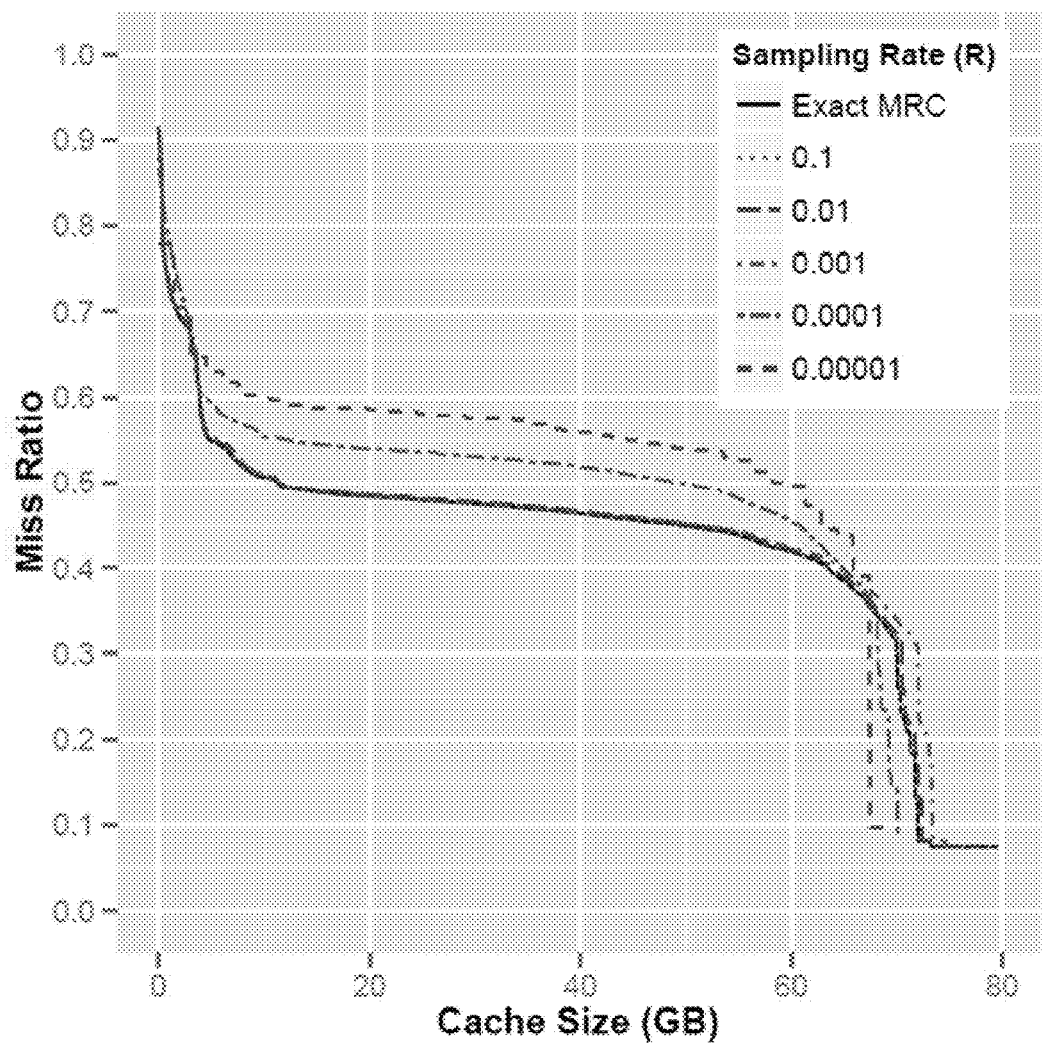
FIGS. 3A-11 are plots showing comparative results of embodiments of SHARDS either with different parameter settings, or as compared with various sets of exact trace data, or both.
Figure 3B:
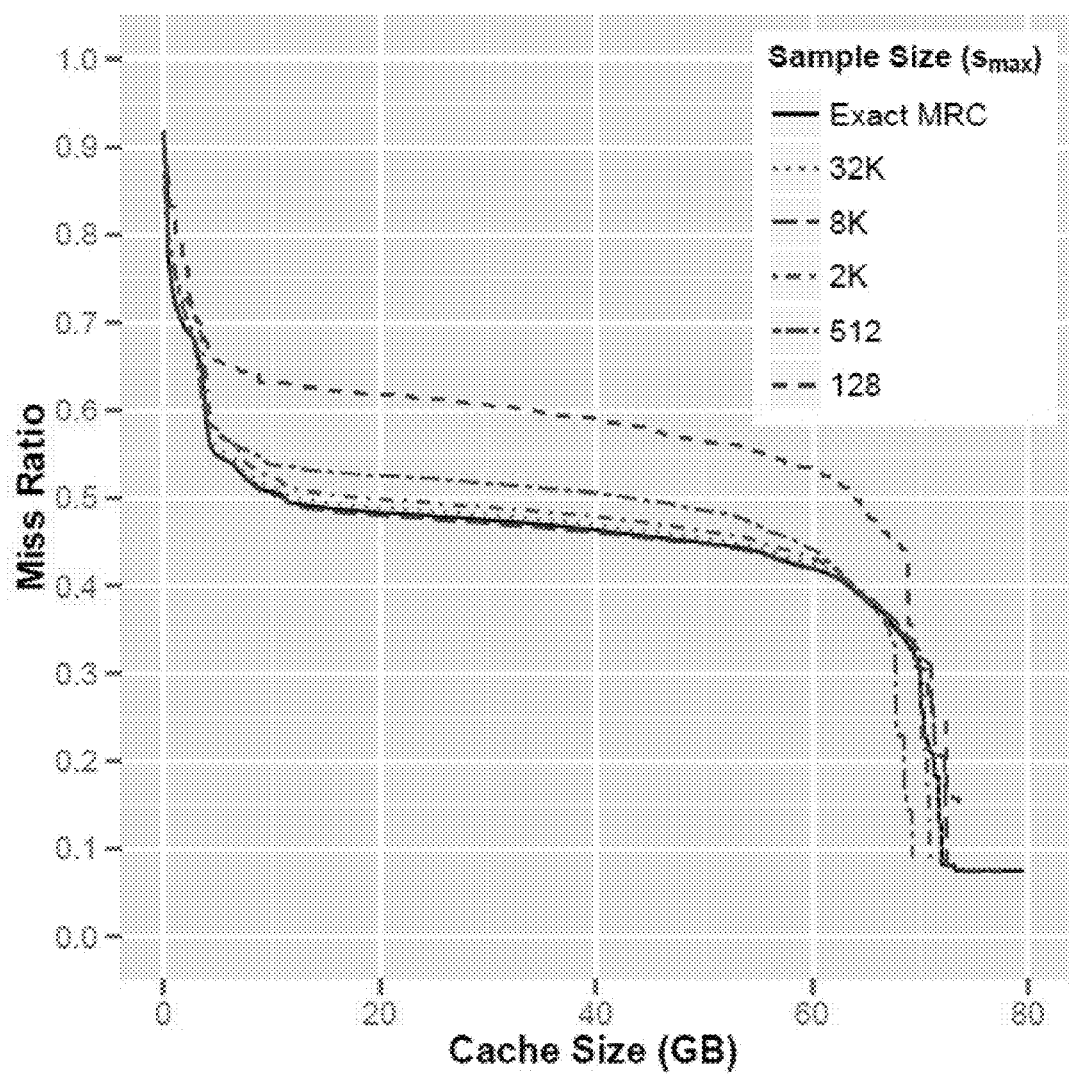

FIG. 3A presents an example application of fixed-rate SHARDS, using a real-world storage block I/O trace (a Customer VM disk trace t04, which also appears later in FIG. 5). In FIGS. 3A and 3B, MRCs are constructed for a block I/O trace containing 69.5M references to 5.2M unique blocks, using fixed-rate SHARDS (FIG. 3A), varying R from 0.00001 to 0.1, and fixed-size SHARDS (FIG. 3B), varying $s_{max}$ from 128 to 32K. The exact MRC was constructed using the unsampled, full-trace PARDA baseline. Five approximate MRCs are plotted for different fixed sampling rates, varying R between 0.00001 and 0.1, using powers of ten. Note that the approximate curves for R≥0.001 are nearly indistinguishable from the exact MRC.

Fixed-Size Implementation

With a constant memory footprint, fixed-size SHARDS is suitable for online use in memory-constrained systems, such as device drivers in embedded systems. To explore such applications, the inventors developed a new implementation, while still paying attention to optimizing for space efficiency.

Since all data structure sizes were known up-front in the experiments, memory was allocated only during initialization. In contrast, other implementations may perform a large number of dynamic allocations for individual tree nodes and hash table entries. A single, contiguous allocation is faster, however, and enables further space optimizations. For example, if the maximum number of samples $s_{max}$ is bounded by 64K, "pointers" can be represented compactly as 16-bit indices instead of ordinary 64-bit addresses. Like PARDA, this implementation leveraged Sleator's public-domain splay tree code, although this was simply one possible design choice. In addition to using a splay tree for computing reuse distances, however, the inventors employed a second splay tree to maintain a priority queue representing the sample set S, ordered by hash threshold value. Mapping locations to splay tree nodes was done via a conventional hash table that used chaining for collisions. As an additional space optimization, references between data structures were encoded using small indices instead of general-purpose pointers.

The combined effect of these space-saving optimizations is summarized in Table 1, which reports the per-sample sizes for key data structures.

TABLE 1

Fixed-size SHARDS Data Structure Sizes.
Size (in bytes) used to represent elements of key data structures, for both 16-bit and 32-bit values of $s_{max}$.

| Data structure element | $s_{max}$ <64K | $s_{max}$ <64G |
|---|---|---|
| hash table chain pointer | 2 | 4 |
| hash table entry | 12 | 16 |
| reference splay tree node | 14 | 20 |
| sample splay tree node | 12 | 20 |
| total per-sample size | 40 | 60 |

Additional memory was needed for the output histogram—each bucket consumed 12 bytes to store a count and the update threshold $T_{bucket}$ used for rescaling. For example, with $s_{max}$=8K, the aggregate overhead for samples was found to be only 320 KB. Using 10K histogram buckets, providing high resolution for evaluating cache allocation sizes, consumed another 120 KB. Even when code size, stack space, and all other memory usage were considered, the entire measured runtime footprint remained smaller than 1 MB, making this implementation practical even for extremely memory-constrained execution environments.

FIG. 3B presents results of an example application of fixed-size SHARDS, using the same trace as FIG. 3A. Five approximate MRCs are plotted for different fixed sample sizes, varying $s_{max}$ between 128 and 32K, using factors of four. Note that the approximate curves for $s_{max}$≥2K are nearly indistinguishable from the exact MRC.

Modeling Cache Policy

PARDA uses a simple binary trace format: a sequence of 64-bit references, with no additional metadata. Storage I/O traces typically contain richer information for each reference, including a timestamp, access type (read or write), and a location represented as an offset and length. For the experiments the inventors conducted to evaluate embodiments of this invention, the inventors converted I/O block traces to the simpler PARDA format, assumed a fixed cache block size, and ignored the distinction between reads and writes. This effectively modeled a simple LRU policy with fixed access granularity, where the first access to a block is counted as a miss.

Other SHARDS implementations reflect different caching policies. For example, on a write miss to a partial cache block, a write-through cache may first read the entire enclosing cache block-sized region from storage. The extra read overhead caused by partial writes can be modeled by maintaining separate histograms for ordinary reads and reads induced by partial writes. Other write-through caches manage partial writes by tracking residency at sub-block granularity, which can be modeled using known reuse-distance techniques. See, for example, Thompson, J. G., et al., "Efficient (stack) algorithms for analysis of writeback and sector memories", ACM Trans. Comput. Syst. 7, 1 (January 1989), 78-117. In all cases, hash-based spatial sampling as used in embodiments of SHARDS proved to be extremely effective.

SHARDS MRC Application

Efficiently computing a CUC (that is, miss ratio curve or miss rate curve) provides valuable analytic information, but, ultimately, there is of course a practical use. A CUC represents choices, or trade-offs, between the size of cache allocated or architected vs the frequency of cache misses and thus inefficiency. Given a CUC created by any embodiment of the invention, the system designer may choose an appropriate cache size, either allocated or architected, assuming that the actual reference stream will b eat least approximately the same as the stream used to create the CUC. The designer, or some other entity, may then sample the actual reference stream periodically, generate and analyze the CUC for that stream, and determine if a different cache allocation would better suit the actual or changed conditions.

Alternate Use of MRC

Note that, given an MRC or reuse-distance histogram, it is possible to generate a sequence of references that results in the same histogram or MRC. It is also possible to generate a trace from a reuse distance sequence. (These transformations are one-to-many, which means one can generate many traces with same MRC.) The resulting "synthetic" trace will exhibit the same temporal locality property as the original trace but the compression ratio would be that of the effective sampling rate. Additionally, one can enforce additional constraints when synthesizing these traces, such that additional properties of the original trace are maintained, for example, read-write ratio, request size, spatial locality, etc. Such an application may be useful for maintaining a space-efficient library of different workloads for use in testing various properties of systems, without the cost of keeping the full traces, which are several orders of magnitude larger.

Experimental Evaluation

The inventors conducted a series of experiments with over a hundred real-world I/O traces collected from a commercial caching analytics service for virtualized environments. Below is described first the data collection system; thereafter, the trace files used are characterized. Next is presented an evaluation of the accuracy of approximate MRCs. Finally, results of performance experiments are presented that demonstrate the space and time efficiency of our implementations.

Data Collection

The inventors used a Software-as-a-Service caching analytics service designed to collect block I/O traces for VMware virtual disks in customer data centers running the VMware ESXi hypervisor. A user-mode application, deployed on each ESXi host, coordinated with the standard VMware vscsiStats utility to collect complete block I/O traces for virtual machine (VM) virtual disks. A web-based interface allowed particular virtual disks to be selected for tracing remotely.

Compressed traces were streamed to a cloud-based back-end to perform various storage analyses, including offline MRC construction using SHARDS. If the trace was not needed for additional storage analysis, SHARDS sampling was performed locally, obviating the need to stream full traces. Ideally, SHARDS should be integrated directly with the kernel-mode hypervisor component of vscsiStats for maximum efficiency, enabling continuous, online reuse-distance analysis. This is also an option for general implementations of embodiments of SHARDS.

Trace Files

The inventors used 106 week-long vscsiStats traces, collected by the caching analytics service from virtual disks in production customer environments. These traces represented VMware virtual disks with sizes ranging from 8 GB to 34 TB, with a median of 90 GB. The associated VMs were a mix of Windows and Linux, with up to 64 GB RAM (6 GB median) and up to 32 virtual CPUs (2 vCPUs median). In addition, the inventors included several publicly-available block I/O traces from the SNIA IOTTA repository. The inventors used a dozen week-long enterprise server traces collected by Microsoft Research Cambridge, as well as six day-long server traces collected by FIU. See Koller, R., et al., "I/O deduplication: Utilizing content similarity to improve I/O performance", Trans. Storage 6, 3 (September 2010), pp. 13:1-13:26. In total, this provided a diverse set of 124 real-world block I/O traces to evaluate the accuracy and performance of SHARDS compared to prior art exact methods.

Accuracy

The inventors analyzed the accuracy of MRCs constructed using SHARDS by comparing them to corresponding exact MRCs without sampling. Differences between the approximate and exact curves were measured over a wide range of sampling parameters. Numerous MRC plots are shown in the Figures as visual examples of SHARDS' accuracy.

Parameters

The SHARDS system may support many configuration parameters. In the experiments, the inventors specified, for example, a 16 KB cache block size, so that a cache miss would read from primary storage in aligned, fixed-size 16 KB units; typical storage caches in commercial virtualized systems employ values between 4 KB and 64 KB. As discussed above, reads and writes were treated identically, effectively modeling a simple LRU cache policy. By default, the inventors specified a histogram bucket size of 4K cache blocks, so that each bucket represented 64 MB. Fixed-rate sampling is characterized by a single parameter, namely, the sampling rate R, which the inventors varied between 0.0001 and 0.1 using powers of ten. Fixed-size sampling has two parameters: the sample set size, $s_{max}$, and the initial sampling rate, $R_0$. The inventors varied $s_{max}$ using powers of two between 64 and 32K, and use $R_0=0.1$, since this rate is sufficiently high to work well with even small traces.

Error Metric

To analyze the accuracy of SHARDS, the inventors considered the difference between each approximate MRC, constructed using hash-based spatial sampling, and its corresponding exact MRC, generated from a complete reference trace. An intuitive measure of this distance, also used to quantify error in related work, is the mean absolute difference or error (MAE) between the approximate and exact MRCs, evaluated at several different cache sizes. This difference is between two values in the range [0, 1], so an MAE of 0.01 represents 1% of that range.

Figure 4:
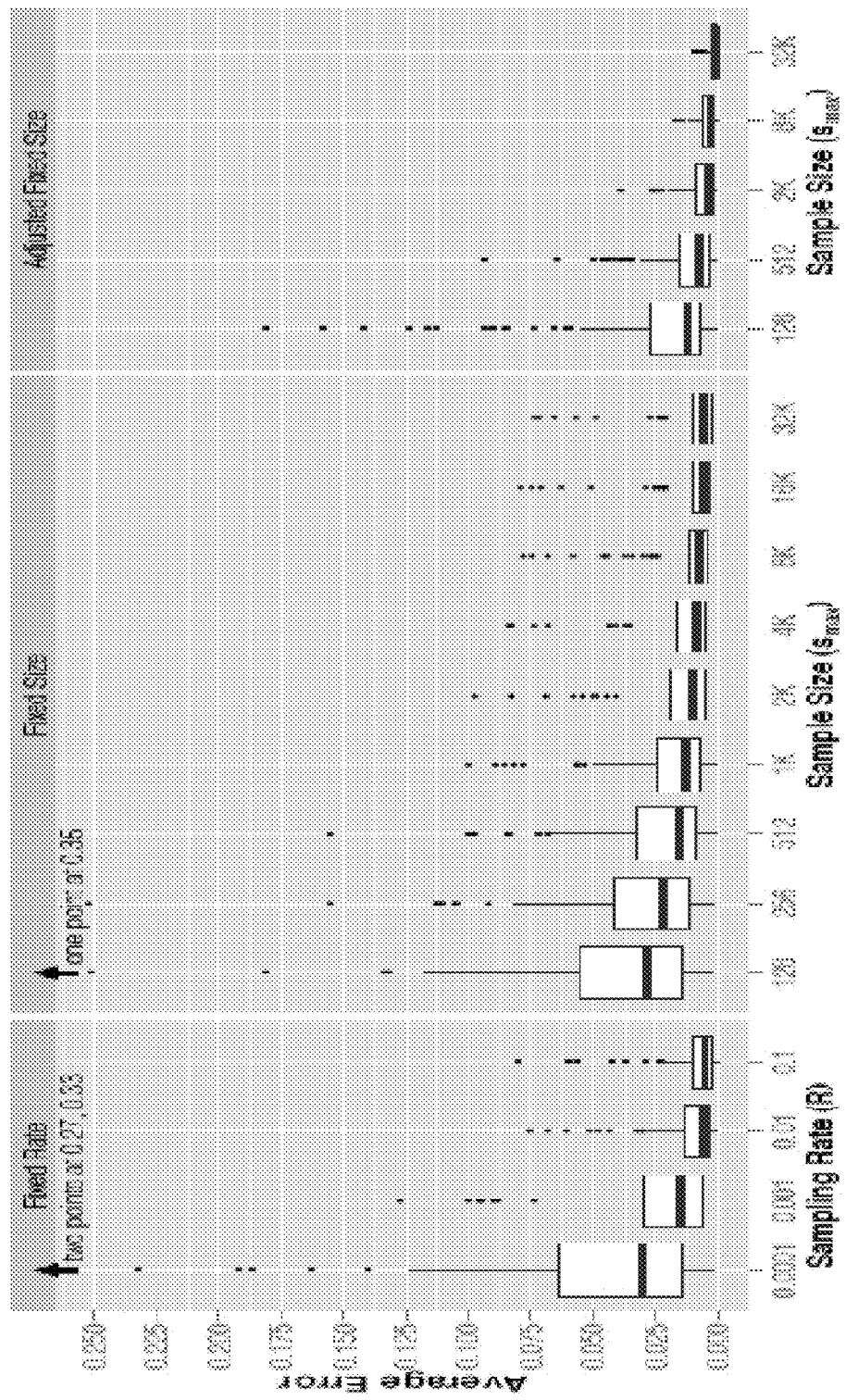

FIG. 4 illustrates the error analysis, with box plots showing the MAE metric for a wide range of fixed-rate and fixed-size sampling parameters. The top and the bottom of each box in FIG. 4 represent the first and third quartile values ($Q_1$, $Q_3$) of the error. The thin whiskers represent the min and max error, excluding outliers. Outliers, represented by dots, are the values larger than $Q_3+1.5 \times IQR$, where $IQR=Q_3-Q_1$. For each trace, this distance was computed over all discrete cache sizes, at 64 MB granularity (corresponding to all non-zero histogram buckets). Overall, the average error proved to be exceptionally small, even for low sampling rates and small sample sizes. Fixed-rate sampling with R=0.001, for example, resulted in approximate MRCs with a MAE of less than 0.02; most exhibited an MAE bounded by 0.05. The error for fixed-rate SHARDS typically has larger variance than fixed-size SHARDS, indicating that accuracy is better controlled via sample count than sampling rate. For fixed-size SHARDS with $s_{max}=8K$, the MAE was found to be 0.0072, with a worst-case of 0.078. Aside from a few outliers, error was bounded by 0.021.

Using Reference Estimates to Reduce Error

In cases where SHARDS exhibited non-trivial error relative to an exact MRC, the inventors found that a coarse "vertical shift" often accounted for most of the difference, while finer features were modeled accurately. One embodiment of SHARDS therefore incorporates an adjustment that, in such cases, improves accuracy significantly; this embodiment is referred to here as $SHARDS_{adj}$.

Spatial sampling selects a static set of blocks. If the dynamic behavior of the sample set differs too much from that of the complete trace, the weights of the sums of histogram buckets (or of any other structure used to compile the cache utility values) and the total count of accesses from the reuse histogram will be off, skewing the resulting MRC. For example, excluding too many or too few very hot blocks biases dynamic access counts. Ideally, the average number of repetitions per block should be the same for both the sample set and the complete trace. This happens when the actual number of sampled references, $N_s$, matches the expected number, $E[N_s]=N \cdot R$. When this does not occur, it will generally be because the sample set contains the wrong proportion of frequently accessed blocks. In this embodiment, a correction of $(E[N_s]-N_s)$ is therefore added to the first histogram bucket before computing final miss ratios. The adjustment embodied in $SHARDS_{adj}$ involves adding the difference, $E[N_s]-N_s$, to the first histogram bucket before computing final miss ratios.

Figure 5:
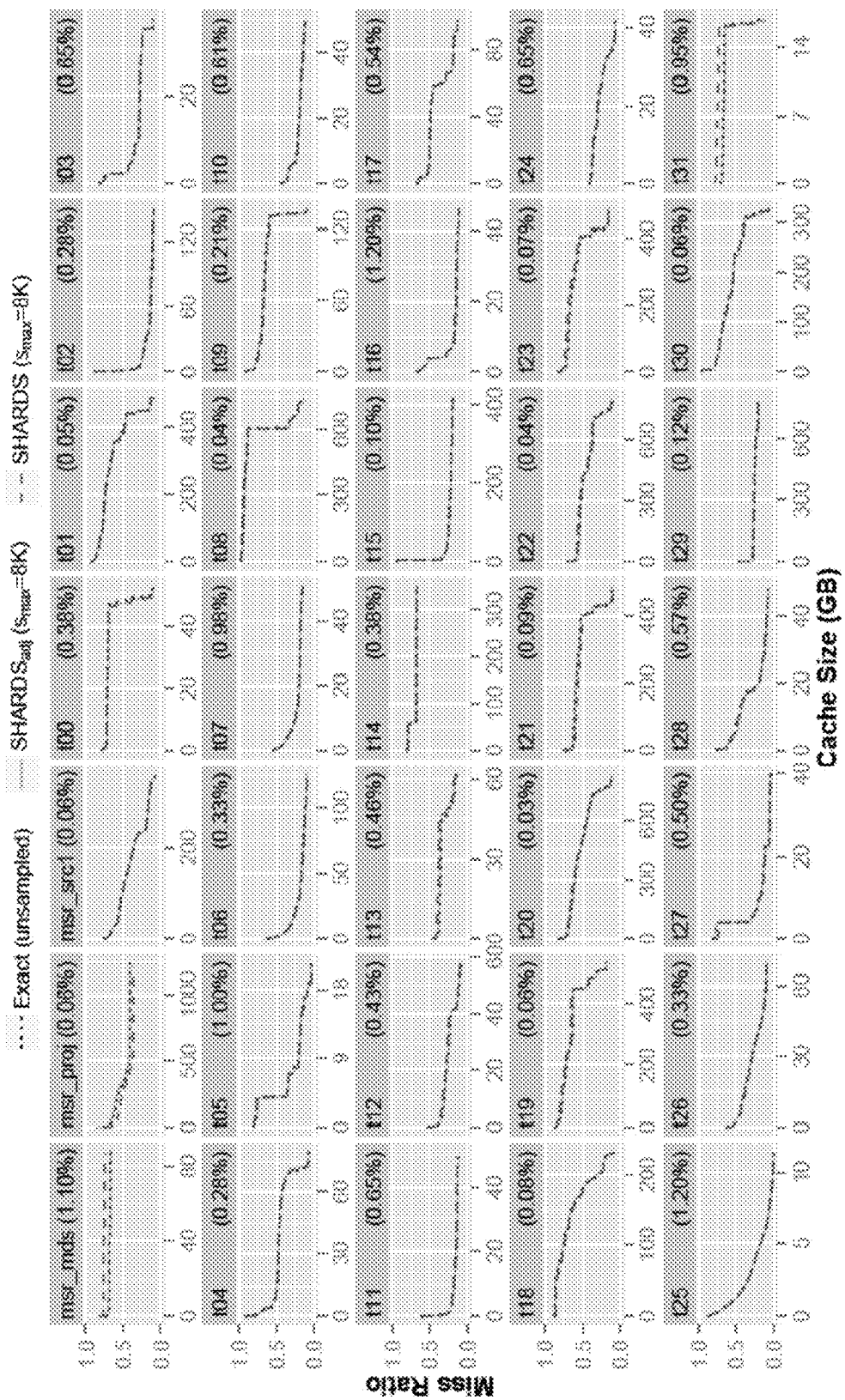

The results of this adjustment, included in $SHARDS_{adj}$, are illustrated in FIGS. 4 and 5. Note that it would also be possible to similarly adjust histogram buckets other than only the first, even all of the buckets, or any sub-set of the buckets. Adjustment of only the first bucket, however, is the basis of the results shown, by way of example only, in the figures. If the adjustment leads to any prefix sums becoming negative, this can be dealt with, for example, simply by treating them as being zero.

To better understand this correction, note that the expected value for the number of samples is simply the total number of references in the trace (N), multiplied by the sampling rate (R). For example, if the system samples 0.1% of blocks (via spatial hashing), and the samples are representative, then if there are one million references, the system can expect one thousand to be sampled. By adding the adjustment at the end, after the histogram has already been constructed, the system knows N. It also knows R, since it was specified. For fixed-rate SHARDS, R is specified directly. For fixed-size SHARDS, where the sampling rate adapts, the system may use the final sampling rate as R, and $N_s$ is the sum of all of the bucket counts (which have already been rescaled to reflect sampling rate changes). The system will therefore have all of the information needed to compute $R*N-N_s$ and perform the adjustment.

FIG. 4 illustrates that the error with $SHARDS_{adj}$ is even lower than with "normal" SHARDS: Across all 124 traces, the adjustment reduced the median fixed-size SHARDS error, with $s_{max}=8K$ to 0.0027, and the worst-case to 0.017, factors of nearly 3× and 5×, respectively. Excluding the two outliers, the MAE was bounded at 0.012. Surprisingly, with just 128 samples, the median MAE was only 0.012.

A second alternate approach assumes that the average ratio of references to unique locations is roughly the same for the sampled and unsampled cases. Let M denote the number of unique references, with $M_t$ and $M_s$ indicating, respectively, the total and sampled number of unique references. (In fixed-size embodiments, $M_s$ will be the same as $s_{max}$.) First, determine $N_t$ and also $M_t$ (for example, by using a probabilistic counter such as HyperLogLog to count the number of distinct elements in the complete stream). From the sampled reuse histogram, compute $N_s$. The number of unique blocks in the sample set, $M_s$ is then given from the size of the sample set since it consists of that unique set of blocks. When the sampled and unsampled cases agree, it can then be assumed that $N_t/M_t=N_s/M_s$. If this is not true, then the system may compute k where $N_t/M_t=(N_s+k)/M_s$ and add k to the value of the smallest bucket in the sampled reuse histogram. Solving for k, k should be $(N_t*M_s-M_t*N_s)/M_t$. The system may then do a prefix summation and normalization to generate the sampled MRC.

Looking at the two approaches, the first can be simplified. Rather than scale $N_s$ up to get the number of expected references in the complete trace, one can scale $N_t$ down to what the sample set should have generated: the delta (k) becomes $(N_t*R-M_s)$. In addition, if the sampling rate R is roughly $M_s/M_t$, then the first approach's equation for k is $(N_t*M_s-M_t*N_s)$ or $(N_t*M_s-N_s*M_t)/M_t$. Alternatively, the second approach's equation of $(N_t*M_s-M_t*N_s)/M_t$ can be simplified to $(N_t*M_s/M_t-N_s)$. This shows that the two approaches are equivalent since R is equivalent to $M_s/M_t$.

In general, the correction involves aligning the sampled histogram's summary statistics with those of the complete trace by ensuring that the number of repetitions per location is the same for the sample-set-derived histogram and for that of the complete trace. In general, the correction may be based on the difference between any predetermined statistic computed over the complete trace, and the same statistic computed over the sampled subset. In the examples described above, this is done by modifying the bucket counts in the sampled reuse distance histogram so that they sum to the expected number of references for a sample-set that size. The modification is preferably done to the lowest bucket, since most of the error is in either over- or undersampling those blocks that are most frequently accessed (and so have the smallest reuse-distances).

Detection of bias or divergence between the statistical behavior of the sampled and unsampled cases can be used in other ways to improve accuracy. In another approach, one can generate N separate sample sets and reuse distance histograms, each using its own hash function for block selection. One can then compare which of the sample sets' outputs most closely match the behavior of the complete, unsampled case. For example, this comparison could choose the sample set whose references-to-unique-locations most closely matches the unsampled case. That ratio could be estimated using the threshold as in the first approach above or through directly estimating as is done in the second approach. Having chosen the best matching sample set, one can then apply additional corrections as outlined above.

Example MRCs

The quantitative error measurements revealed that, for nearly all traces, with fixed-size sampling at $s_{max}=8K$, (the effective sampling rates appear in parentheses), the miss ratios in the approximate MRCs deviated only slightly from the corresponding exact MRCs. FIG. 5 plots 35 approximate MRCs, together with the matching exact curves; note that, in most cases, the curves are nearly indistinguishable. Trace names are shown for three public MSR traces (see Narayanan, D., et al., "Write off-loading: Practical power management for enterprise storage", Trans. Storage 4, 3 November 2008, 10:1-10:23); others are anonymized as t00 through t31. In all cases, the location of prominent features, such as steep descents, appear faithful. Each plot is annotated with the effective dynamic sampling rate, indicating the fraction of IOs processed, including evicted samples. This rate reflects the amount of processing required to construct the MRC. $SHARDS_{adj}$ thus effectively corrected all cases with visible error. For trace t31, the worst case over all 124 traces for SHARDS, error was still reduced from 0.078 to 0.008.

Sampling Rate Adaptation

Figure 6:
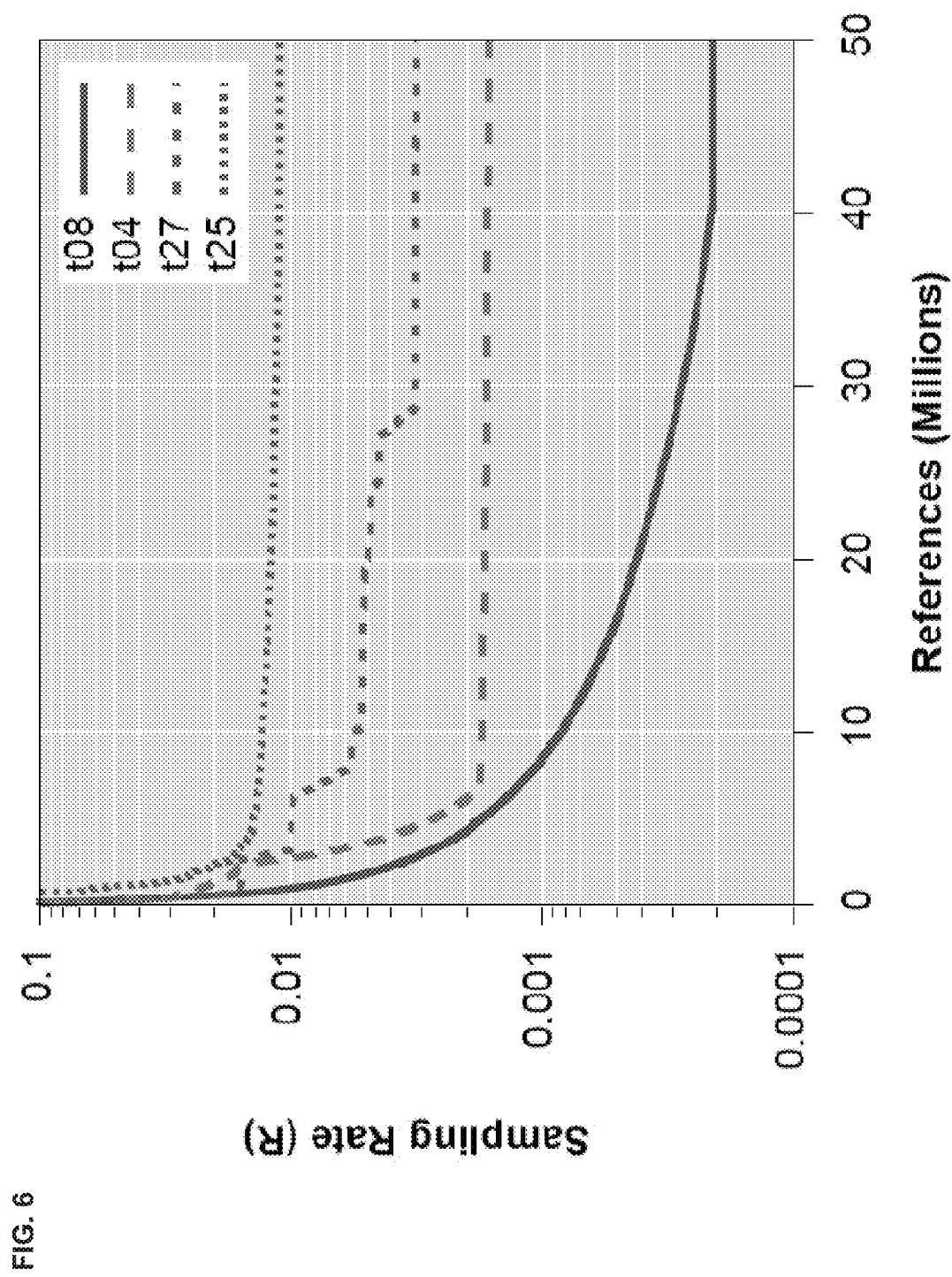

Choosing a sampling rate that achieves high accuracy with good efficiency is challenging. The automatic rate adaptation of fixed-size SHARDS is advantageous because it eliminates the need to specify R. FIG. 6 plots R as a function of reference count for four diverse traces: t08, t04, t27, and t25 from FIG. 5. For each, the sampling rate started at a high initial value of $R_0=0.1$, and was lowered progressively as more unique locations were encountered. The figure shows that SHARDS adapts automatically for each of the traces, which contain significantly different numbers of unique references. After 50 million references, the values of R for these traces were 0.0002, 0.0016, 0.0032, and 0.0111. The total number of samples processed, including evictions from the fixed-size sample set S, is given by the area under each curve.

Quantitative experiments thus confirmed that, for nearly all workloads, SHARDS yields accurate MRCs, in much less time and space than conventional exact algorithms. While the accuracy achieved with high sampling rates may not be surprising, success with very low rates, such as R=0.001, was unexpected. Even more extraordinary is the ability to construct accurate MRCs for a broad range of workloads, using only a small constant number of samples, such as $s_{max}$=8K, or even $s_{max}$=256.

Performance

The inventors conducted performance experiments in a VMware virtual machine, using a 64-bit Ubuntu 12.04 guest running Linux kernel version 3.2.0. The VM was configured with 64 GB RAM, and 8 virtual cores, and executed on an under-committed physical host running VMware ESXi 5.5, configured with 128 GB RAM and 32 AMD Opteron x86-64 cores running at 2 GHz.

To quantify the performance advantages of SHARDS over exact MRC construction, the inventors used a modern high-performance reuse-distance algorithm from the open-source PARDA implementation as a baseline. Although the main innovation of PARDA is a parallel reuse distance routine, the inventors used a known sequential "classical tree-based stack distance" baseline. The PARDA parallelization technique would likely also result in further performance gains for SHARDS.

Space

To enable a fair comparison of memory consumption with SHARDS, the inventors implemented minor extensions to PARDA, adding command-line options to specify the number of output histogram buckets and the histogram bucket width. Code was also added to obtain accurate runtime memory usage. All experiments were run over the full set of traces described above in the "Trace Files" section. Each run was configured with 10 thousand histogram buckets, each 64 MB wide (4K cache blocks of size 16 KB), resulting in an MRC for cache allocations up to 640 GB.

Figure 7:
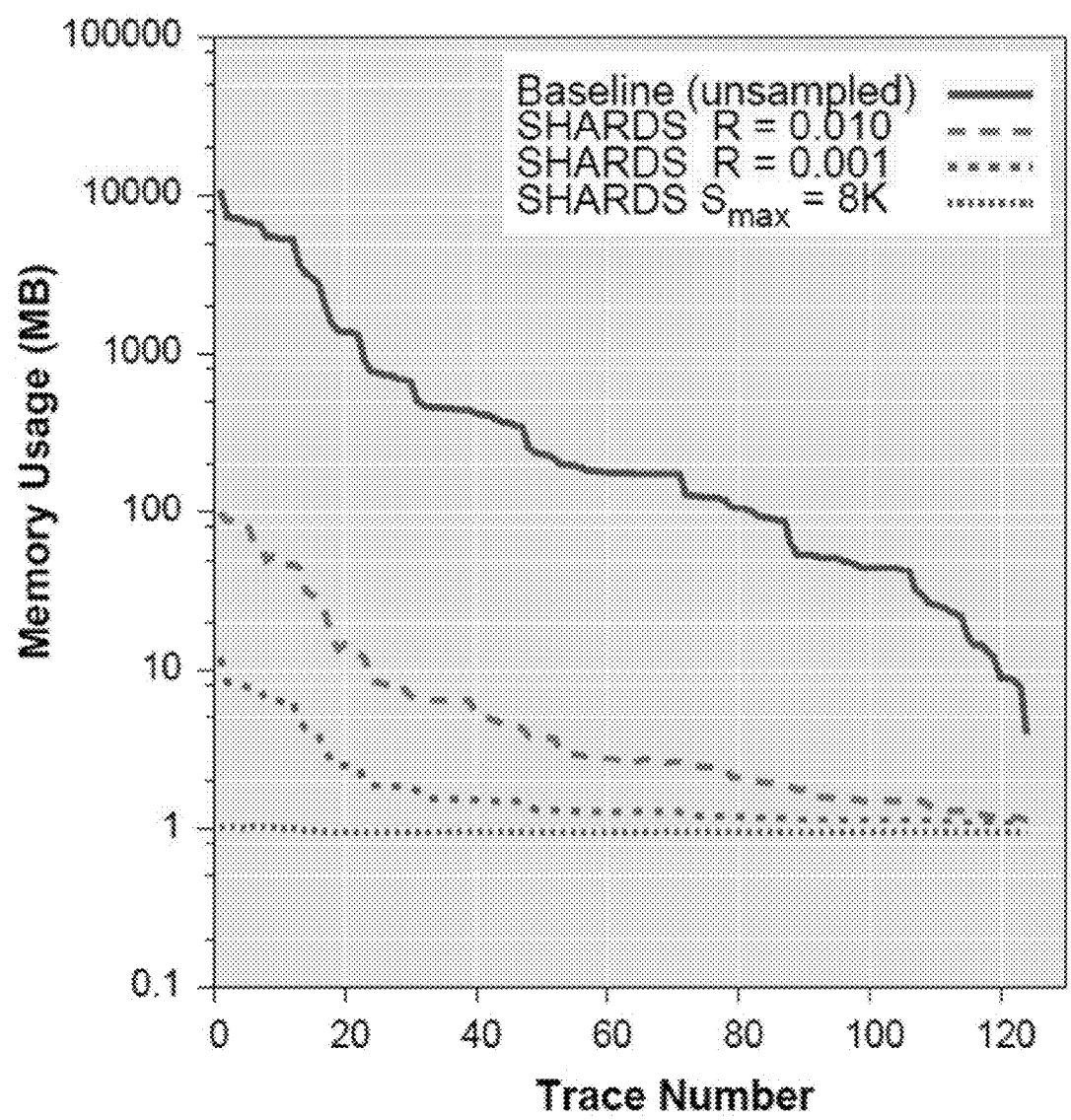

Sequential PARDA served as a baseline, representing an efficient, exact MRC construction algorithm without sampling. Fixed-rate SHARDS, implemented via the code modifications described in the "Fixed-Rate Implementation" section above, was configured with R=0.01 and R=0.001. Finally, the new space-efficient fixed-size SHARDS implementation, presented in the "Fixed-Size Implementation" section above, was run with $s_{max}$=8K and $R_0$=0.1. FIG. 7 illustrates the memory usage for each algorithm over the full set of traces, ordered by baseline memory consumption, for an unsampled baseline, with fixed-rate SHARDS (R=0.01, 0.001), and fixed-size SHARDS ($s_{max}$=8K). The drastic reductions with SHARDS required the use of a logarithmic scale. As expected, for traces with large numbers of unique references, the memory required for fixed-rate SHARDS is approximately R times as big as the baseline. With much smaller traces, fixed overheads dominate. For fixed-size SHARDS, the runtime footprint remained approximately 1 MB for all runs, ranging from 964 KB to 1,044 KB, with an average of 974 KB, yielding a savings of up to 10,800× for large traces and a median of 185× across all traces.

Time

Figure 8:
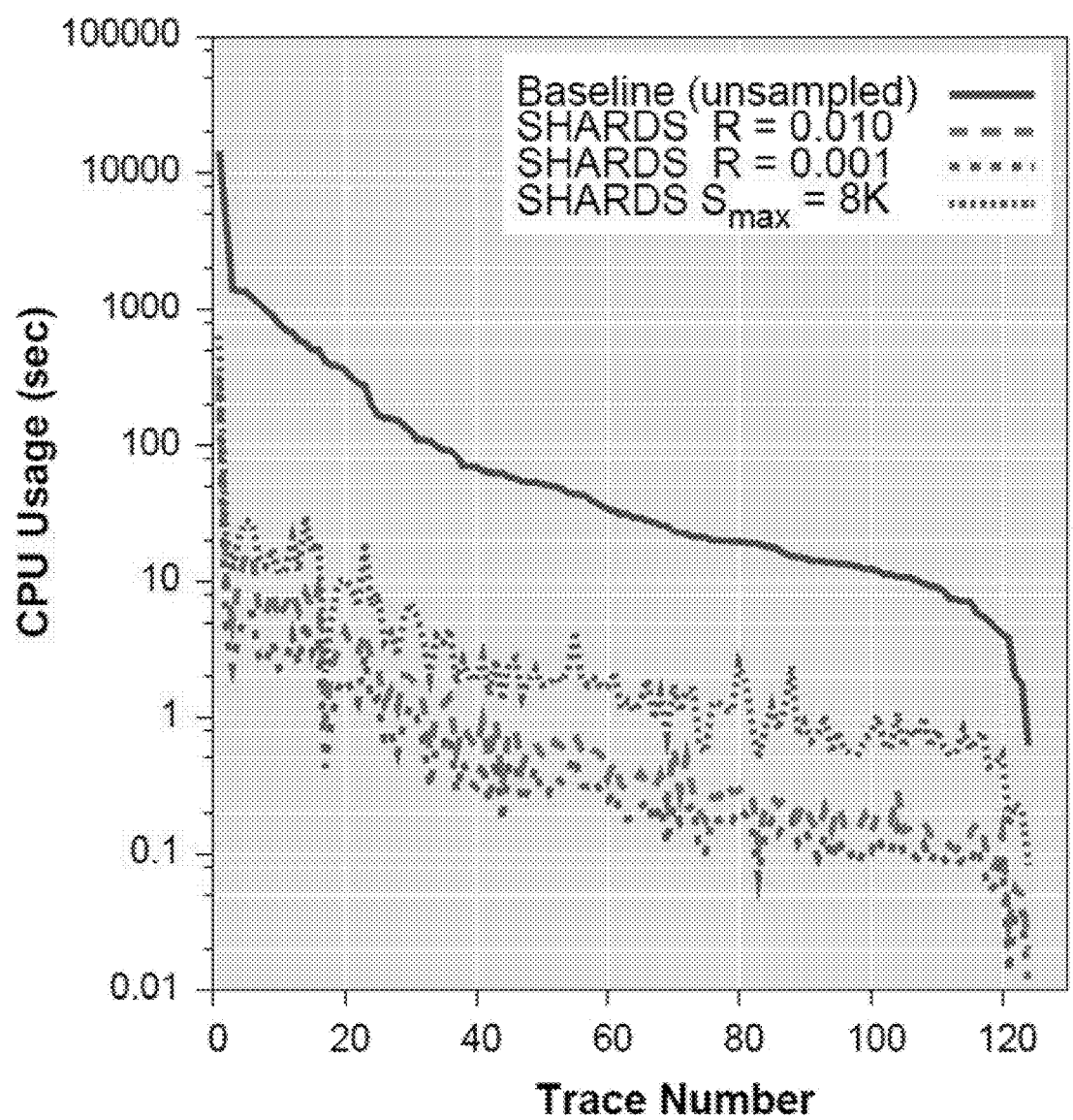

FIG. 8 plots the CPU usage measured for the same runs described above, ordered by baseline CPU consumption. In FIG. 8, runtime was measured (in seconds, log scale) for an unsampled baseline, with fixed-rate SHARDS (R=0.01, 0.001), and fixed-size SHARDS ($s_{max}$=8K). The processing time reductions with SHARDS were so great that a logarithmic scale is used. Fixed-rate SHARDS with R=0.01 resulted in speedups over the baseline ranging from 29× to 449×, with a median of 75×. For R=0.001, the improvement ranged from 41 × to 1,029×, with a median of 128×. For short traces with relatively small numbers of unique references, fixed overheads dominated, limiting speedups to values lower than implied by R.

Fixed-size SHARDS with $s_{max}$=8K and $R_0$=0.1 incurs more overhead than fixed-rate SHARDS with R=0.01. This is due to the non-trivial work associated with evicted samples as the sampling rate adapts dynamically, as well as the cost of updating the sample set priority queue. Nonetheless, fixed-size SHARDS still achieved significant speedups over the baseline, ranging from 6× to 204×, with a median of 22×. In terms of throughput, for the top three traces ordered by CPU consumption in FIG. 8, fixed-size SHARDS processes an average of 15.4 million references per second.

MRCs for Mixed Workloads

Figure 9:
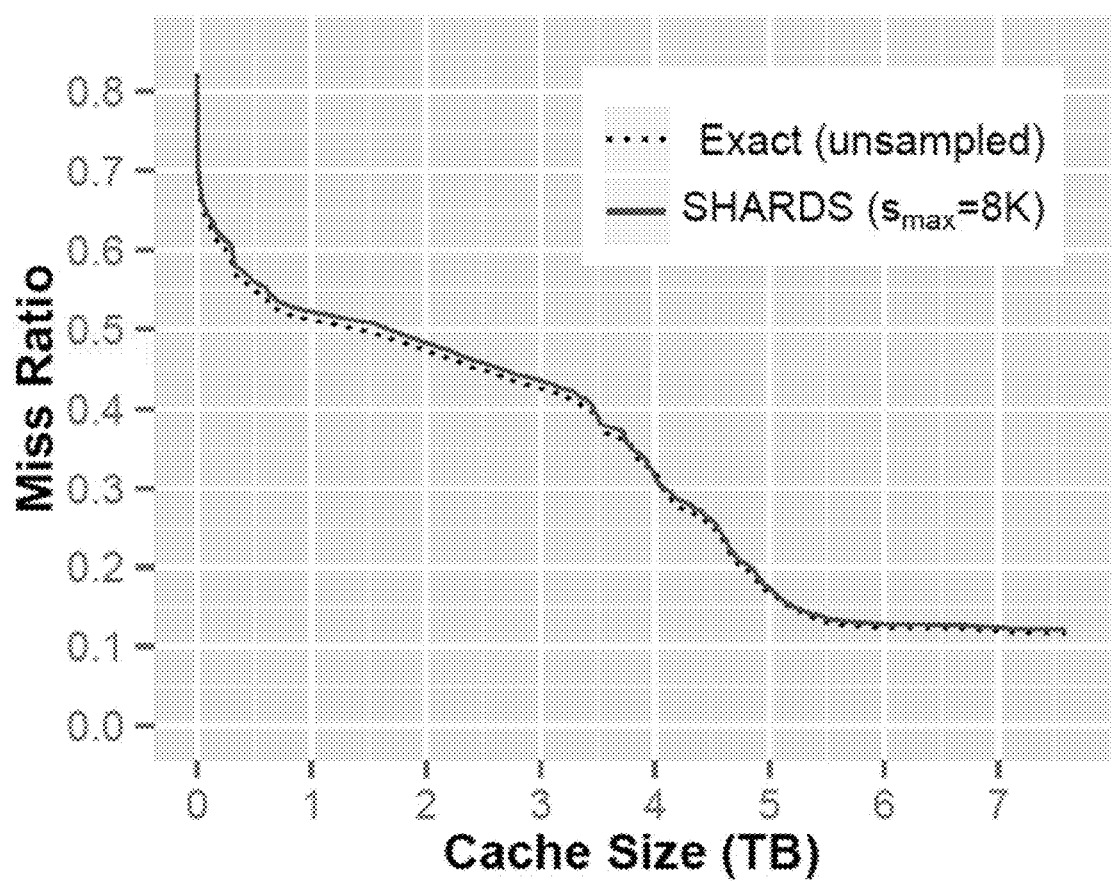

The VM-based traces discussed above represent single-machine workloads, while the IOs received by storage arrays are typically an undistinguished, blended mix of numerous independent workloads. FIG. 9 demonstrates the accuracy of fixed-size SHARDS using a relative-time-interleaved reference stream combining all 32 virtual disk traces (t00 . . . t31) shown in FIG. 5. With $s_{max}$=8K, SHARDS exhibited a small MAE of 0.008 despite being 32,000× more space-efficient. The high accuracy and extremely low overhead provided additional confidence that this invention finally provides continuous, practical online MRC construction and analysis for production storage arrays. FIG. 9 illustrates exact and approximate MRCs for merged trace interleaving 4.3G IOs to 509M unique blocks from 32 separate virtual disks.

Non-LRU Replacement Policies

SHARDS as described above constructs MRCs for a cache using an LRU replacement policy. The same underlying hash-based spatial sampling approach may be applied, however, for simulating other, non-stack-based policies, such as LIRS (Jiang, S., et al., "LIRS: An efficient low inter-reference recency set replacement policy to improve buffer cache performance", Proceedings of the 2002 ACM SIGMETRICS International Conference on Measurement and Modeling of Computer Systems, New York, N.Y., USA, 2002, SIGMETRICS '02, ACM, pp. 31-42); ARC (Megiddo, N., et al., "A self-tuning, low overhead replacement cache", Proceedings of the 2nd USENIX Conference on File and Storage Technologies, Berkeley, Calif., USA, 2003, FAST '03, USENIX Association, pp. 115-130); (Bansal, S., et al., "CAR: Clock with adaptive replacement", Proceedings of the 3rd USENIX Conference on File and Storage Technologies, Berkeley, Calif., USA, 2004, FAST '04, USENIX Association, pp. 187-200); or Clock-Pro (Jiang, S., et al., "Clock-pro: An effective improvement of the clock replacement", Proceedings of the Annual Conference on USENIX Annual Technical Conference, Berkeley, Calif., USA, 2005, ATEC '05, USENIX Association, pp. 35-35). SHARDS may be used even with other stack-based methods than LRU. For example, cache entries could be sorted according to MRU, that is, most recently used, or by frequency instead of recency, such as according to a LFU (Least Frequently Used) policy.

Figure 10:
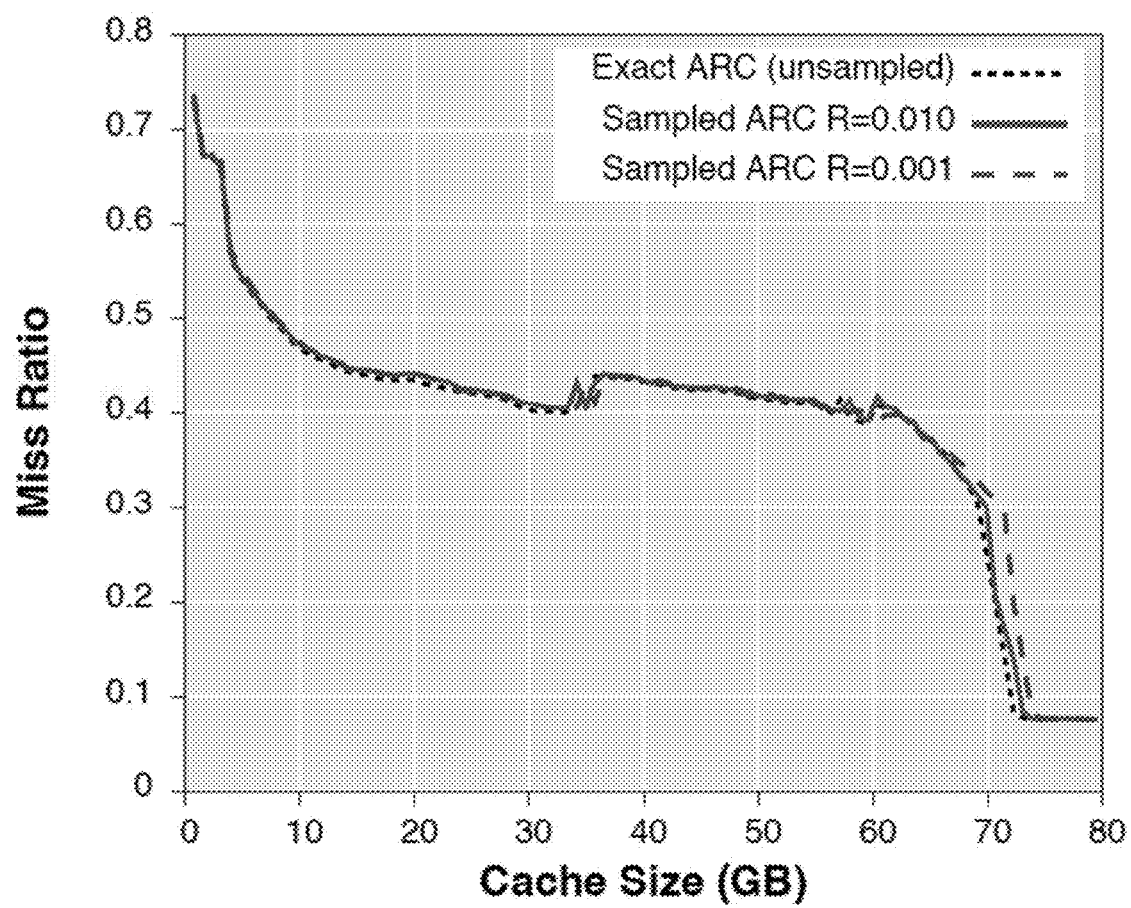

By way of example, FIG. 10 illustrates the results of a scaled-down ARC simulation, with exact and approximate MRCs for VM disk trace t04. Note that ARC is just one example of an alternate, non-LRU policy that can be informed by multiple instances of a "simplified" embodiment; other examples of such policies are mentioned in the preceding paragraph, and still others are also known in the art. In FIG. 10, each curve plots one hundred separate ARC simulations at different cache sizes. As with fixed-rate SHARDS, the input trace was filtered to select blocks that satisfied a hash-based sampling condition, corresponding to the sampling rate R. A series of separate simulations was run, each using a different cache size, which was also scaled down by R. FIG. 10 presents results for the same VM disk trace as in FIG. 3, leveraging an open-source ARC implementation. For R=0.001, the simulated cache capacity was only 0.1% of the desired cache size, thus achieving huge reductions in both space and time, while still exhibiting excellent accuracy, with an MAE of 0.01. This embodiment is simplified in the sense that it implements multiple cache policy simulations without needing the data structures illustrated in FIG. 2; however, spatial sampling, shown as block/component 310 in FIG. 2 and FIG. 12 (see below) is applied and the sampled references are fed into multiple cache simulation instances, each of which executes a particular caching algorithm of interest. Each instance preferably has a different particular cache size, rescaled to reflect the sampling rate.

Note that, in these embodiments, rescaling (step 360 in FIG. 2) may involve, for example, the numbers of entries in a simulated cache, as opposed to reuse distances, scaled down by the sampling rate. The result is a set of discrete miss ratios (or rates) corresponding to points on the CUC at particular cache sizes. For example, with a sampling rate of 0.1% (=1/1000), a series of cache sizes (along the MRC x-axis) can be sampled, each of which are also scaled down by a factor of 1000. Note that the multiple simulations can optionally be run in parallel, e.g. feeding each sample that passes the filter into each of several cache-simulation instances.

Other Applications of $SHARDS_{adj}$ Adjustment

The theory behind the corrective adjustment ($E[N_s]-N_s$) described above may be extended to correct for sampling bias in analyses of other properties as well. In general, the property of interest in the original trace may be measured to yield an "expected value". This property may then be measured in the sampled trace (the "actual value") and a corresponding adjustment may be computed and applied.

A similar adjustment technique may also be used with non-LRU policies. Running a separate simulation for each cache size on the MRC, one could also adjust the simulated miss ratio directly (note that there would be no Mattson-style reuse histogram in this case). For example, if the simulated miss ratio is totalMisses/totalRefs, the system could add the difference ($E[N_s]-N_s$) to both the numerator and denominator.

Comparison of SHARDS with Specific Prior Art

The figures and the related discussion above explain and illustrate how SHARDS has proven to be not only highly efficient, but also highly accurate in determining MRCs, even under what, for prior art systems, would be conditions of impossibly few samples, assuming such systems can work with samples at all.

One known technique involves temporal sampling, which reduces reference-tracking costs by only doing so some of the time. For example, Berg, et al. ("StatCache: A Probabilistic Approach to Efficient and Accurate Data Locality Analysis", Proceedings of the 2004 IEEE International Symposium on Performance Analysis of Systems and Software, ISPASS-2004, Austin, Tex., USA, March 2004; and "Fast Data-Locality Profiling of Native Execution", Proceedings of ACM SIGMETRICS 2005, Banff, Canada, June 2005) sample every Nth reference (in particular, one in every 10K) to derive MRCs for caches. Bryan and Conte's cluster sampling ("Combining cluster sampling with single pass methods for efficient sampling regimen design", 25th International Conference on Computer Design, ICCD 2007, 7-10 October 2007, Lake Tahoe, Calif., USA, Proceedings (2007), IEEE, pp. 472-479). RapidMRC (Tam, D. K., et al., "RapidMRC: Approximating L2 miss rate curves on commodity systems for online optimizations", Proceedings of the 14th International Conference on Architectural Support for Programming Languages and Operating Systems, New York, N.Y., USA, 2009, ASPLOS XIV, ACM, pp. 121-132) and work on low-cost tracking for VMs (Zhao, W., et al., "Low cost working set size tracking", Proceedings of the 2011 USENIX Conference on USENIX Annual Technical Conference, Berkeley, Calif., USA, 2011, USENIXATC '11, USENIX Association, pp. 17-19), by contrast, divide the execution into periods in which references are either sampled or are not. They also tackle how to detect phase changes that require regeneration of the reuse distances. RapidMRC reports a mean average error rate of 1.02 misses per thousand instructions (MPKI) with a maximum of 6.57 MPKI observed. Zhao, et al., report mean relative errors of 3.9% to 12.6%. These errors are significantly larger than what SHARDS achieves.

One challenge when sampling references is that reuse distance is a recurrent behavior. One known solution is to extract a sample from the trace based on an identifying characteristic of its references. Spatial sampling uses addresses to select a sample set. Content-based sampling does so by using data contents. Both techniques can capture all events for a set of references, even those that occur rarely. Many analyses for set-associative caches have used set-sampling. For example, UMONDSS (Qureshi, M. K., et al., "Utility-based cache partitioning: A low-overhead, high-performance, runtime mechanism to partition shared caches", Proceedings of the 39th Annual IEEE/ACM International Symposium on Microarchitecture, Washington, D.C., USA, 2006, MICRO 39, IEEE Computer Society, pp. 423-432) reduces the cost of collecting reuse-distances by sampling the behavior of a subset of the sets in a processor cache. Hill et al. ("A comparison of trace-sampling techniques for multimegabyte caches", IEEE Transactions on Computers 43, 1994, pp. 664-675) compare temporal sampling, set-sampling and constant-bit sampling of references and find that the last technique is most useful when studying set-associative caches of different dimensions. Many techniques targeting hardware implementations use grouping or spatial sampling to constrain their use of space; however, these tend to focus on narrow problems such as limited set associativity or limited cache size ranges for each MRC.

Like these approaches, SHARDS reduces and bounds space use, but unlike them, it models the full range of cache sizes. In addition, these techniques do not report error rates. Inspired by processor hardware for cache sampling, Waldspurger, et al., (see U.S. Pat. No. 8,694,728) proposed constructing an MRC by sampling a fixed set of pages from the guest-physical memory of a VM. Unfortunately, practical sampling requires using small (4 KB) pages, increasing the overhead of memory virtualization. Choosing sampled locations up-front is also inefficient, especially for workloads with large, sparse address spaces. In contrast, SHARDS does not require any information about the address space. Xie, et al., ("Estimating duplication by content-based sampling. In Presented as part of the 2013 USENIX Annual Technical Conference, USENIX ATC 13, San Jose, Calif., 2013, USENIX, pp. 181-186) address a different problem: estimation of duplication among blocks in a storage system. The Xie, et al., system hashes the contents of blocks producing fingerprints. These are partitioned into sets with one set chosen as the sample. Their model has error proportional to the sample-set size. This property is used to dynamically repartition the sample so that the sample size is bounded. Xie, et al., looks at individual blocks' hash values and how these collide, but, unlike SHARDS, fails to accurately capture the relationship between pairs of accesses to the blocks.

A number of analytical models have been proposed to approximate MRCs with reduced effort. By constraining how blocks are replaced in a cache, Tay and Zou ("A page fault equation for modeling the effect of memory size", Perform. Eval. 63, 2, February 2006, pp. 99-130) derive a universal equation that models cache behavior from a small set of sampled data points. He, et al., ("FractalMRC: Online cache miss rate curve prediction on commodity systems", IPDPS '12, 2012, pp. 1341-1351) propose modeling miss ratio curves as fractals and claim error rates of 7-10% in many cases with low overhead. Berg, et al. (see reference above), use a closed-form equation of the miss rate. Through a sequence of sampling, deriving local miss rates and combining these separate curves, they model caches with random or LRU replacement. Others model cache behavior by tracking hardware performance counters. Unlike such analytical approaches, SHARDS estimates the MRC directly from the sampled trace. The inventors have shown that SHARDS can be implemented using constant space and with high accuracy. Whereas the error of SHARDS is small, the analytic techniques report errors of a few percent to 50%, with some outliers at 100-200%.

Recently, Wires, et al., ("Characterizing storage workloads with counter stacks. In Proceedings of the 11th USENIX Conference on Operating Systems Design and Implementation", Berkeley, Calif., USA, 2014, OSDI '14, USENIX Association, pp. 335-349) presented a new approximation technique for computing MRCs using a counter. Whereas Mattson's basic technique tracks reuse distances as counts of unique references between repetitions, their "counter stack" approach extends this in three ways. First, the counts of repetitions, themselves, can be computed by comparing changes in the number of unique references seen from different starting points in the stream. The sequence of locations observed by a newer counter is a proper suffix of the sequence recorded by an older one. So, if the newer counter increases but the older does not, then the older location must have repeated, and its reuse-distance is the older counter's value. Second, the repetitions and reuse-distances can be approximately efficiently using a bounded set of counters. Instead of starting a new counter with every reference, one may downsample the set of counters, creating and tracking a new one periodically. The set can be further pruned since, over time, adjacent counters converge as they observe the same set of elements. Using probabilistic counters based on the HyperLogLog algorithm together with downsampling and pruning, the counter stack approach uses only (log M) space. Third, columns of counts in the counter stack can be periodically written to a checkpoint together with timestamps for subsequent analysis. Checkpointed counterstack sequences can be spliced, shifted temporally, and combined to model the behavior of combinations of workloads. Because the checkpoint captures only stacks of counts at each timestamp, such modeling assumes that different checkpoints access disjoint sets of blocks.

Figure 11:
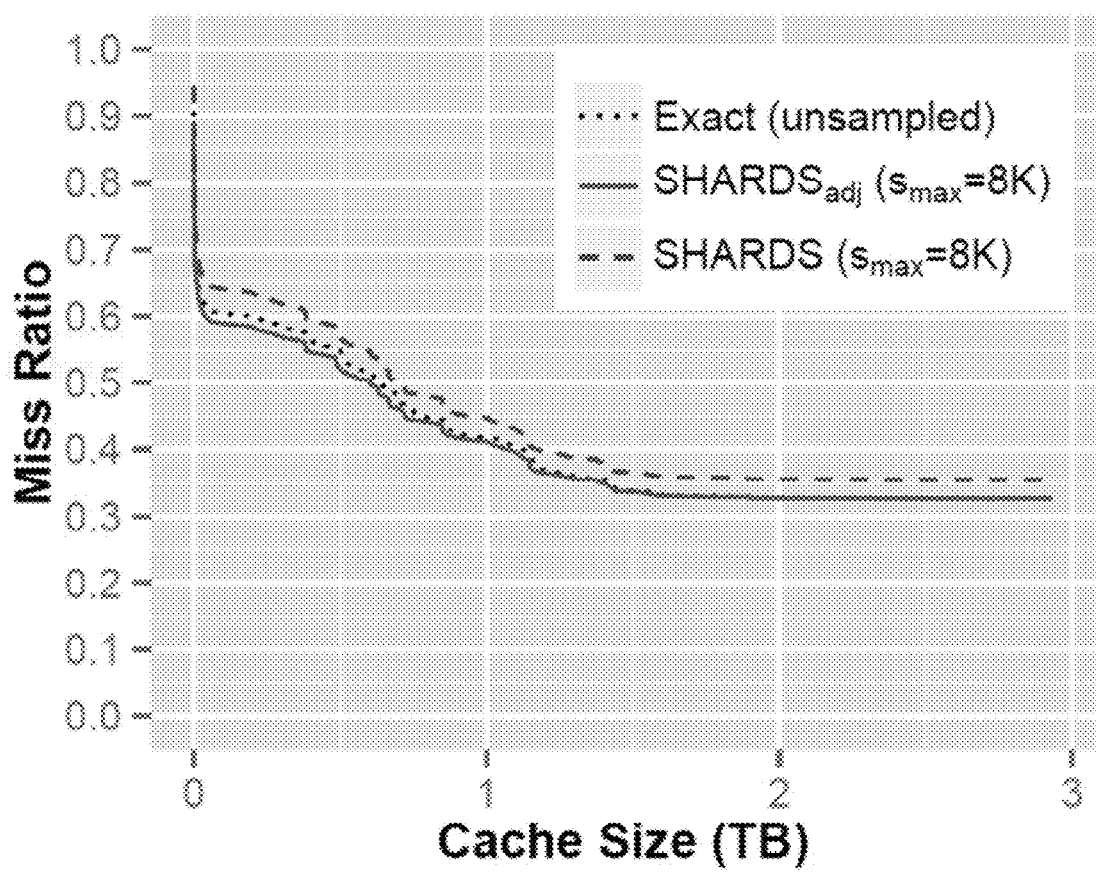

To provide a direct quantitative comparison with SHARDS, the inventors generated the same merged "master" MSR trace used by Wires, et al., configured identically with only read requests and a 4 KB cache block size. FIG. 11 shows MRCs constructed using fixed-size SHARDS, with 48K histogram buckets of size 64 MB, supporting cache sizes up to 3 TB. For $s_{max}$=8K, the average absolute error is 0.006 with $SHARDS_{adj}$ (0.029 unadjusted). The MRC is computed using only 1.3 MB of memory in 137 seconds, processing 17.6M blocks/sec. Wires, et al., report that Counter Stacks requires 80 MB of memory, and 1,034 seconds to process this trace at a rate of 2.3M blocks/sec. In this case, Counter Stacks is approximately 7× slower and needs 62× as much memory as $SHARDS_{adj}$. While Counter Stacks uses log M space, fixed-size SHARDS computes MRCs in small constant space. As a result, separate SHARDS instances can efficiently compute multiple MRCs, tracking different properties or time-scales for a given reference stream, which Wires, et al., claim is not practical. Moreover, unlike Counter Stacks, SHARDS maintains the identity of each block in its sample set. This enables tracking additional information, including access frequency, making it possible to directly implement other policies such as LFU, LIRS, ARC, CAR, or Clock-Pro, as discussed above.

System Implementation

Figure 12:
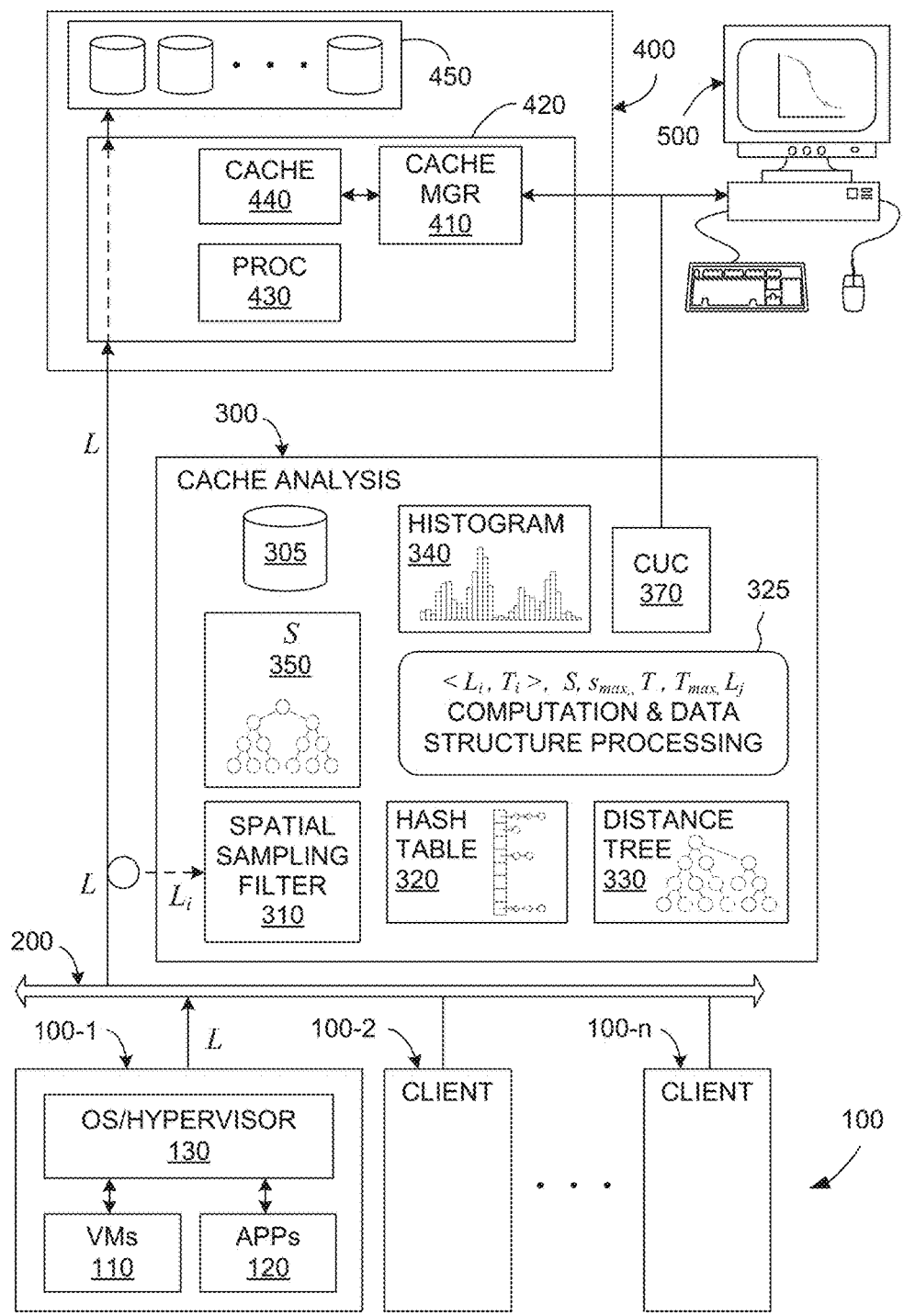
FIG. 12 illustrates the main hardware and software components of a cache analysis system that implements different embodiments, as well as how the analysis system may interact with clients, a computer system whose cache is of interest, and a user/administrator.

FIG. 12 illustrates a representative system that implements SHARDS embodiments. Depending on whether a fixed-rate, or fixed-size embodiment, or both, that a user wishes to be able to take advantage of, some of the components may not be included. The various computational and other data-processing steps described above, and illustrated in general in FIG. 2, are carried out my executing appropriate modules of computer-executable code that may be stored, that is, embodied, in any conventional non-transitory medium and will be loaded into system memory for execution by the system processor(s). Although several modules are shown as being separate in FIG. 12, it would also be possible to combine some or all of them into single bodies of code, which may then be loaded as a unit.

One or more clients 100 (such as an application, a virtual machine, a host, a hardware entity, some aggregation of any or all of these, etc.) includes, by way of example, a system 100-1 that may include virtual machines 110 and/or other applications 120 running on a hypervisor/operating system 130; as well as other clients 100-2, . . . , 100-n.

A primary system 400 includes at least one storage system 450, which may be of any type or configuration, from a single disk to a mixed storage technology system spread over multiple servers and locations in the "cloud". An access management system 420, which may be a dedicated system or simply the storage access components of a conventional server, mediates I/O operations with the storage system 450 and will typically include one or more processors 430. In this example, the primary system is shown as including a cache 440 (which may be part of the processing system 430 itself) and a component (software, firmware, etc.) 410 that manages cache operations such as cache 440 partitioning (if implemented) and allocation for entities, such as the clients 100, that issue read and write requests to the storage device(s) 450. As is mentioned below, however, some embodiments of the invention may help the administrator of the primary system decide whether to include a cache at all.

The storage devices 450 may, but need not be located in the same place (such as in a distributed "cloud" storage environment) and may be of any type, such as solid-state devices (SSDs), including but not limited to flash drives, RAM-based storage systems, or slower electromechanical storage systems. The storage devices may be of different technology types, and may have any block or page size. The only assumption is that there is some form of location identifier L that may also be used to identify a corresponding cache entry if the data at L is in fact cached.

The clients are any entities that address the storage system 450 either directly or, more likely, via one or more intermediate address translations. Depending on the chosen implementation, the clients may communicate data requests to one or more cooperating servers via a bus, a network, or any other communications channel, all of which are indicated collectively by reference number 200. In some implementations, all or some of the clients 100-1, . . . , 100-$n$ (also referred to as C1, . . . , Cn for succinctness) may be incorporated into the primary system 400 itself, in which case no network will normally be needed for them. In the illustrated example, a reference stream is issuing from client 100-1 for data at locations L. (For simplicity and clarity, any intermediate address translations are ignored here.) This invention does not presuppose any type of client, which may be any software and/or hardware entity—or any combination of software and/or hardware entities—that addresses the storage system 450 and whose possible or actual need for cache allocation is to be tested and, optionally, adjusted.

In the embodiment illustrated in FIG. 12, only one of the clients (100-1) is shown as transmitting a streams of reference requests L to access the storage system 450, but it is to be understood that, in practice, any and usually all of the clients will be doing so at the same time, in which case a cache analysis system 300 can tap, segregate, and analyze each stream separately, or treat all references from all clients as simply parts of a single stream. The references (all or for only designated clients) are passed to or tapped by the cache analysis system 300, which may be free-standing or incorporated into another system, including the primary system 400.

The cache analysis system 300 here includes a buffer/storage component 305, which may be a hardware device such as a flash memory, disk, RAM, access to an external storage (even directly to the storage system 450), that stores the location identifiers L submitted by any or all of the clients that one desires to construct a CUC for, as well as any or all of the data structures described here.

In some implementations, the references (submission of storage location identifiers L) of more than one, or even all, of the clients, for example, all of the VMs on a single host, may be considered as a whole for analysis. In other cases, however, cache analysis is preferably done per-client so as to be able to construct a separate cache utility curve CUC for each client. For per-client analysis, each reference may be tagged in any known manner with a client identifier such that the respective client's references are segregated for storage and processing. The storage component 305 may therefore segregate submitted identifiers per-client, although it could also be arranged through filtering that only one client's identifiers are captured and stored at a time for analysis.

The cache analysis system 300 will also include one or more processors, system software, including some form of operating system, as well as other conventional hardware and software components used to access the reference stream, for example by tapping the network/bus 200, to execute the code that defines the various software modules, and to communicate with any peripheral devices such as a display 500. These are not shown in FIG. 12 merely for the sake of succinctness.

The cache analysis system 300 stores and, using known methods, maintains the various data structures such as trees, hash tables, lists, etc., that implement the hash table 320, the distance tree 330, the histogram 340, and the set S 350. A module 325 is included to perform the various computations and data-processing steps described above and shown generally in FIG. 2.

The results of the analysis are made available to a cache utility curve (CUC, such as an MRC or HRC) compilation module 370, which may compile the results as per-client statistics, for example, in value range bins such as are used to form histograms; if a histogram presentation is preferred, then it can optionally be taken directly from the histogram structure 340. Particularly in implementations that are fully automated, the per-client CUC(Ci) results may then be passed to a workstation monitor 500, which can then display the current CUC estimate, for example, either as a whole or for a selected client. The monitor 500 may also be included to allow a system administrator to communicate various parameters to the analysis system 300 to change the threshold T, the modulus P, the selection of client(s) to analyze, etc. Other parameters that an administrator might want to set and adjust in the sampling module might be how often sampling and MRC-construction should be done. Typical times might be on the order of minutes or even hours, but the decision could also be based on a large enough (determined by the administrator) change in the number and/or type of clients that need to share the cache. Of course, all such manual settings could also be accomplished automatically by programming suitable heuristic algorithms.

The CUC may also, or instead, be passed to the cache manager 410, which then may then adjust, either under operator control or automatically, the current cache allocations for the respective clients so as to improve the cache performance.

Note that it is not necessary to store the actual data associated with references, since the caching routine doesn't depend on the actual data contents, but rather only the location alone and, depending on implementation, the size of the cache line/block. Since the tag size is typically much smaller than the data size, this would have the benefit of reducing the memory footprint significantly.

Note that a single CUC (in particular, MRC) represents miss/hit rates for an entire range of possible cache sizes. In most implementations, the system (human operator or automatic software module or both) will attempt to find some optimal allocation setting for multiple clients. A single client would of course have no competition for cache space at all; nonetheless, the invention may also be useful in single-client situations by providing cache-sizing information, which may be useful for decisions relating to reallocation of unnecessary cache space (for example in main memory or on an SSD) for non-caching purposes. In a sense, the cache analysis system and related method steps create a kind of simulated cache, which simulates either an actual cache, such as cache 440, or a hypothetical cache, such as for the purpose of system design of a real cache. Another example of a single-client implementation would thus be to simulate a single cache size in order to determine, using a simulated hit ratio, whether, for example, it would be advantageous to buy and install a cache card of some given size.

An example of yet another possible use would be in classifying workload behavior, for example, to identify workload types, such as "streaming" (no locality) or "small working set", etc. For automated cache allocation decisions, the cache analysis system may compute the CUCs for different clients, and then the cache manager 410 may choose an efficient operating point (cache size) for each client that maximizes a utility function, such as reducing aggregate misses (across all clients) the most, or a priority-weighted function of miss rates across clients, etc. The system may also attempt to find a point or a range on the CUC that has been pre-defined as optimal in some user-chosen sense.

For optimizing cache allocations across multiple clients, some embodiments may also measure and use the number of hits per unit time. For example, if the hit ratio for client A is much higher than that for client B, but if B has many more accesses than A, then allocating more cache to B (despite its lower hit ratio) may save more total disk accesses over a given time period. Hit rate information may be incorporated in any known manner into the chosen allocation routine.

There are different design and purely administrative choices when it comes to how often a CUC should be constructed for a given client or set of clients. In some cases, static choices may be preferred, such as redoing the CUC-compilation process every n minutes, or every day or hour, or whenever a new client or number of clients enters the system, when some other significant change to the workload is detected, etc. In some other cases, such as where the CUC is constructed online, it may be advantageous to include some form of periodic reset or "aging" to weight more recent accesses more than older accesses. For example, the system could periodically age/decay per-histogram-bucket counts by, for example, dividing the values by two or by applying a decay factor, if such histograms or equivalent structures are used to compile miss statistics. Examples of other possible aging techniques include using a moving average of values and exponentially-weighted moving average (EWMA).

There are different ways to compile the set of location identifiers used for sampling. One way would be for the cache analysis system 300 to tap the location identifier stream L in real time (either via a per-client filter or using segregated, per-client storage) as in the embodiment of FIG. 12 and store the corresponding addresses in the component 305. For example, by interposing on the I/O path in a live system, SHARDS may be used to compute an up-to-date MRC online, at any point in time. Assume, however, that a system administrator (as opposed to the cache analysis system 300) wishes to examine how best to allocate actual cache for a given set of clients. The administrator could compile a log (a "trace") (total, or perhaps a subset, such as identifiers submitted only by clients of interest) of the submitted location identifiers L and then transfer these to the storage component 305 of the cache analysis system 300 for processing. The log could be transferred on a physical medium such as a disk, flash drive, hard drive, etc., or by downloading over a network, depending on the size of the log file and required transfer speed. Compilation of the CUC may then be carried out as before, on the basis of the location identifiers stored in the component 305. The CUC can then be presented in any desired manner, such as on the display of a monitor 500, or sent to the administrator of the primary system 400 to help him determine proper allocation of any actual cache used, or, indeed, if there needs to be a cache at all.

As mentioned above, most implementations of the invention will want to determine cache utility curves per-client and will consequently tag and/or segregate storage references for each client so as to make separate processing more efficient. In cases where one or more clients is a virtual machine, each client may maintain and transmit a buffer of sampled locations L*, independent of its actual accesses to the real storage system. This could be implemented, for example, via a filter driver in the guest OS within a VM, or via a filter driver in the hypervisor. For example, traces may be collected on each host using block trace collection tool such as "ESX vscsiStats" in VMware-based systems, which can collect separate traces for VM virtual disks. The block trace tool could even be modified itself to perform sampling to reduce the data that the hypervisor needs to send for cache analysis. Once the raw trace data is extracted from the hypervisor, it could be sampled before sending it off for analysis; alternatively, the entire trace maybe sent off for analysis, with sampling applied later during the analysis itself.

Examples of Options for Applications

Various uses of the different embodiments are mentioned above, but are only a few of the large number of possibilities. Some uses, such as cache sizing and cache parameter tuning, do not require any changes to the cache itself. In systems that have cache partitioning support, the invention can be used to optimize aggregate performance or, for example to isolate individual clients. The invention can even be used to support "business-related" options, such as providing information that can be used to better fulfill latency or throughput guarantees in Service Level Agreements (SLAs). For example, the invention may be used to help ensure that a set cache size or allocation will ensure some statistical property for latency distribution, such as average latency, n'th percentile, minimum or even maximum latency.

With respect to cache sizing, the invention can be used to support online recommendations, in which MRCs are integrated with a storage controller or to tune and optimize customer workloads. The MRCs could also be presented in a storage management user interface, for example, to report cache size to achieve a desired latency, to enable customers and SEs to self-service sizing, to size an array cache in the field, trigger upselling, etc.

The invention may also be used to help tune a cache policy, for example, to quantify the impact of parameter changes (e.g., cache block size, use of sub-blocks, write-through vs. write-back, a replacement policy, etc.). The invention may also make it possible for a user to explore different tuning policies without having to modify his actual production cache, for example, by simulating multiple configurations concurrently, that is, in parallel, or multiple MRCs, each with different parameters. Even dynamic, online optimization may be enabled, for example, to determine a best configuration in any user-defined sense and then to adjust the actual cache parameters.

Various aspects of performance may also be improved or optimized, including aggregate cache performance, partitioning cache across multiple clients, adapting the cache setting to changing workloads, etc. The system designer or administrator could, for example, allocate space based on client benefit or so as to prevent inefficient space utilization. Optimized partitioning could be used, for example, to isolate and control competing LUNs, VMs, tenants, database tables, etc., to optimize partition sizes using MRCs, etc.

CONCLUSION

The various embodiments of SHARDS provide a new hash-based spatial sampling technique and related system implementation for reuse-distance analysis that computes approximate miss ratio curves accurately using only modest computational resources. The approach may also be used, with modifications that a skilled system programmer will understand, to compute miss rate curves as well. The approach is in many common circumstances so lightweight—operating in constant space, and typically requiring several orders of magnitude less processing than conventional algorithms—that online MRC construction becomes practical. Furthermore, SHARDS enables offline analysis for long traces that, due to memory constraints, could not be realistically accomplished using exact techniques.

Experimental evaluation of SHARDS has demonstrated its accuracy, robustness, and performance advantages, over a large collection of I/O traces from real-world production storage systems. Quantitative results show that, for most workloads, an approximate sampled MRC that differs only slightly from an exact MRC can be constructed in as little as 1 MB of memory. Performance analysis highlights dramatic reductions in resource consumption, in some cases up to 10,800× in memory and up to 204× in CPU.

We claim:

1. A method for adjusting the configuration of a cache within a computer system that includes at least one entity that submits a stream of references, each reference corresponding to a location identifier corresponding to data storage locations in a storage system, the method comprising:
   spatially sampling, at a sampling rate, the stream of references by:
      selecting a threshold value;
      computing a hash value for each reference;
      comparing the hash value for each reference in the stream with the threshold value and selecting only those references whose hash value meets a selection criterion;
   selecting a plurality of caching configurations;
   concurrently applying the selected references as inputs to a plurality of caching simulations each corresponding to a respective one of the caching configurations, and computing a resulting, respective set of cache utility values for each caching simulation;
   selecting an optimal configuration from among the caching configurations as a function of the computed sets of cache utility values for each caching simulation; and
   configuring the cache according to the optimal configuration.

2. The method as in claim 1, in which each caching configuration is a respective cache block size.

3. The method as in claim 1, in which each caching configuration corresponds to a respective choice between write-through and write-back.

4. The method as in claim 1, in which each caching configuration is a respective cache size.

5. The method as in claim 1, further comprising selecting a size of the cache in the computer system by determining an optimal size from the compiled cache utility values for the respective caching configurations.

6. The method as in claim 1, in which each caching configuration corresponds to a respective cache replacement policy.

7. The method as in claim 6, in which cache replacement policies are least recently used (LRU) replacement policies.

8. The method as in claim 6, in which cache replacement policies are low inter-reference recency set (LIRS) replacement policies.

9. The method as in claim 6, in which cache replacement policies are self-tuning, low overhead replacement cache (ARC) policies.

10. The method as in claim 6, in which cache replacement policies are adaptive replacement (CAR) policies using a clock.

11. The method of claim 1, further comprising computing the sets of cache utility values for each caching simulation, selecting the optimal and configuring the cache dynamically, in real time.

* * * * *